US012581954B2

(12) United States Patent
Chen et al.

(10) Patent No.: US 12,581,954 B2
(45) Date of Patent: Mar. 17, 2026

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Ying-Chung Chen, Kaohsiung (TW); Lu-Ming Lai, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 725 days.

(21) Appl. No.: 17/877,795

(22) Filed: Jul. 29, 2022

(65) Prior Publication Data

US 2024/0038677 A1     Feb. 1, 2024

(51) Int. Cl.
| | |
|---|---|
| *H01L 25/16* | (2023.01) |
| *H01L 23/498* | (2006.01) |
| *H01L 23/552* | (2006.01) |
| *H01L 23/00* | (2006.01) |

(52) U.S. Cl.
CPC ...... *H01L 23/552* (2013.01); *H01L 23/49816* (2013.01); *H01L 23/49838* (2013.01); *H01L 23/49861* (2013.01); *H01L 25/167* (2013.01); *H01L 24/16* (2013.01); *H01L 24/48* (2013.01); *H01L 2224/16245* (2013.01); *H01L 2224/48245* (2013.01); *H01L 2924/12041* (2013.01); *H01L 2924/12043* (2013.01); *H01L*

*2924/1433* (2013.01); *H01L 2924/1461* (2013.01); *H01L 2924/182* (2013.01); *H01L 2924/3025* (2013.01)

(58) Field of Classification Search
CPC . H01L 23/49861; H01L 25/167; H01L 23/13; H01L 23/49541
See application file for complete search history.

(56) References Cited

U.S. PATENT DOCUMENTS

| | | | |
|---|---|---|---|
| 6,977,431 B1 | 12/2005 | Oh et al. | |
| 8,390,083 B2 | 3/2013 | O'Donnell et al. | |
| 2012/0126269 A1* | 5/2012 | Tanuma | H10H 20/852 438/27 |
| 2017/0083740 A1* | 3/2017 | Chang | G06V 40/13 |
| 2018/0114875 A1* | 4/2018 | Ho | H10F 55/255 |
| 2019/0123081 A1* | 4/2019 | Chang | H01L 21/568 |

* cited by examiner

*Primary Examiner* — Michele Fan
(74) *Attorney, Agent, or Firm* — Foley & Lardner LLP

(57) ABSTRACT

A semiconductor device package and a method of manufacturing a semiconductor device package are provided. The semiconductor device package includes a carrier, a protective element, and a sensor device. The protective element encapsulates the carrier. The sensor device is embedded in the carrier and the protective element. The sensor device includes a sensing portion and a protective portion adjacent to the sensing portion, and the protective portion of the sensor device has a first surface exposed from the protective element and the carrier.

16 Claims, 28 Drawing Sheets

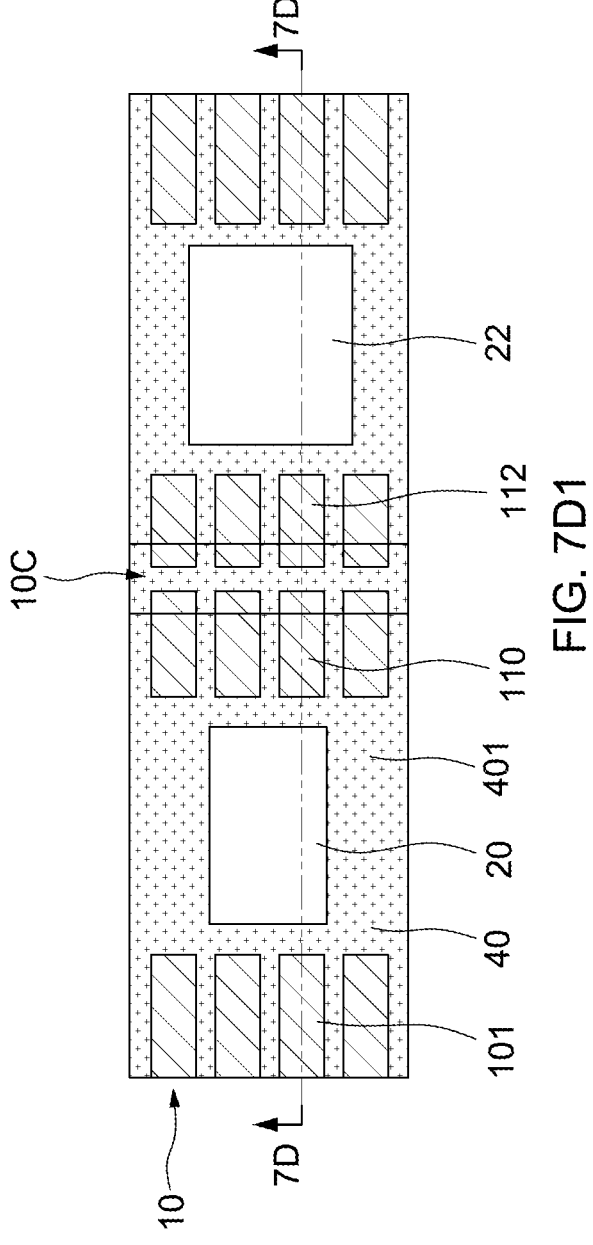
FIG. 7D1

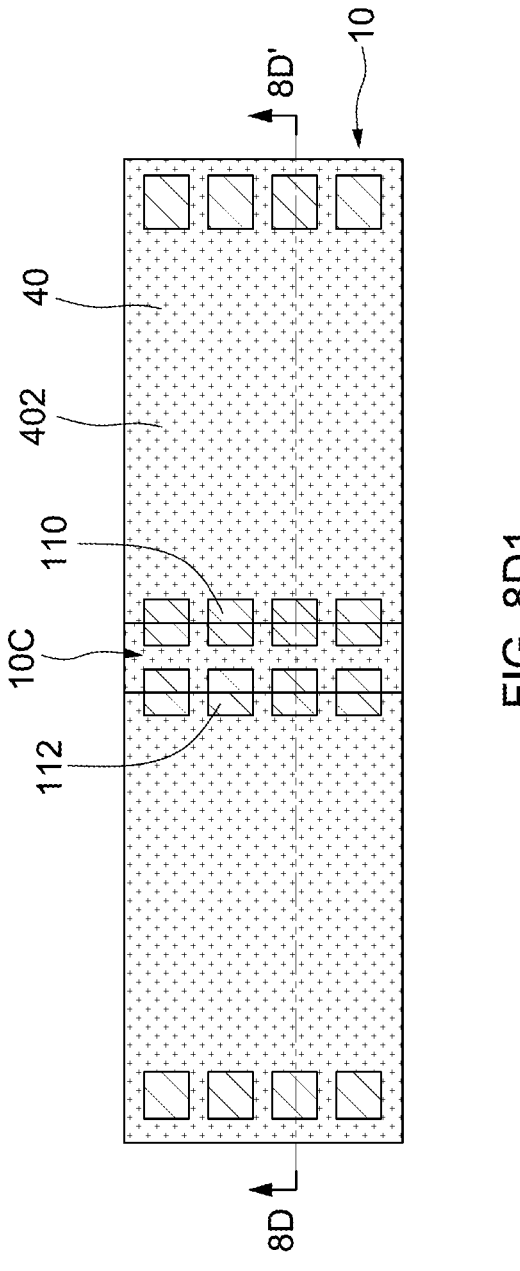
FIG. 8D1

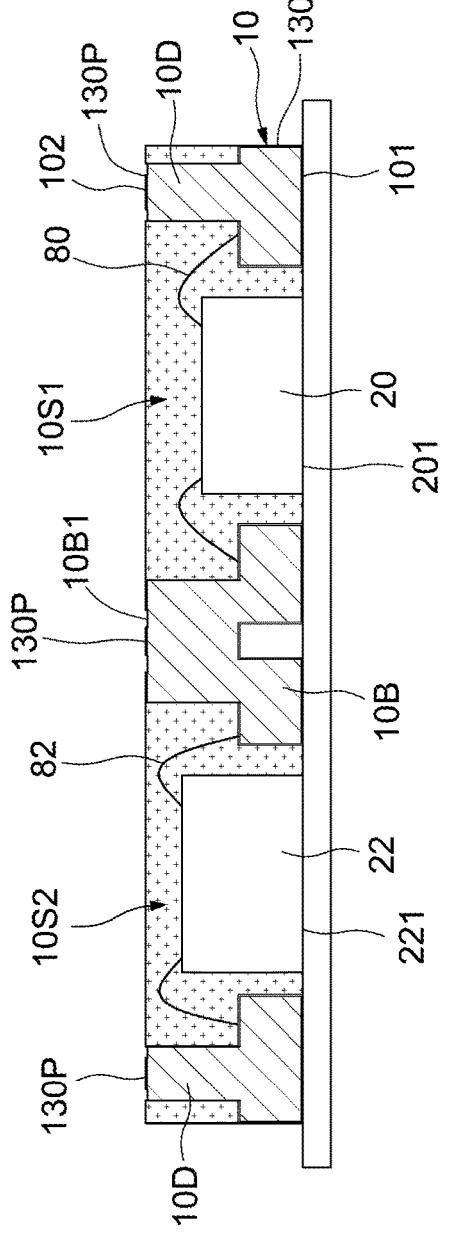
FIG. 10C
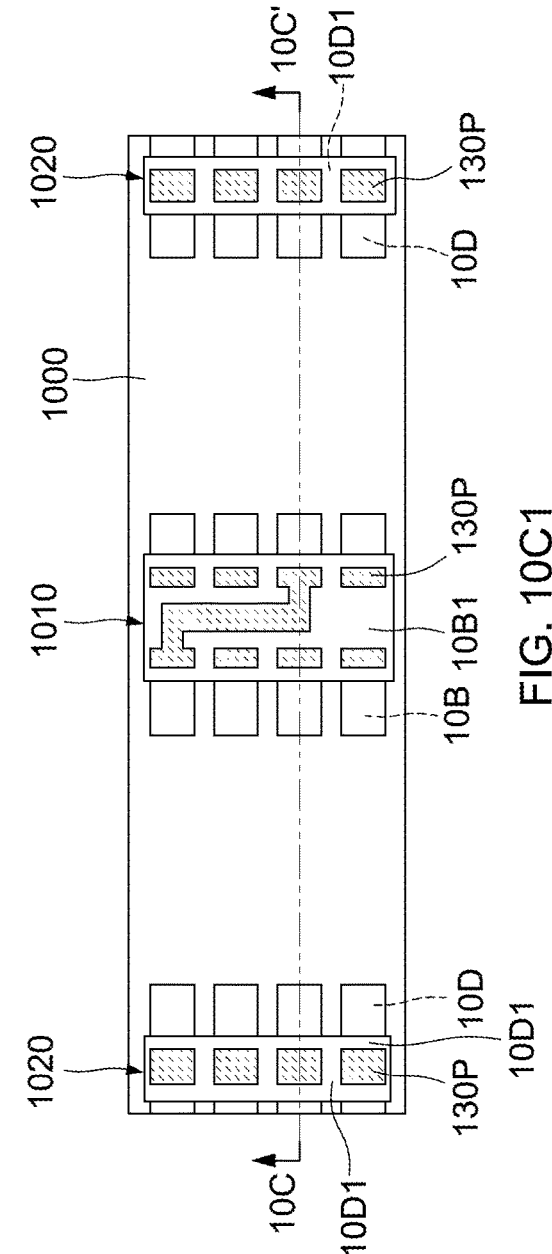
FIG. 10C1

SEMICONDUCTOR DEVICE PACKAGE AND METHOD OF MANUFACTURING THE SAME

BACKGROUND

1. Technical Field

The present disclosure relates generally to a semiconductor device package and a method of manufacturing a semiconductor device package.

2. Description of the Related Art

Semiconductor devices have become progressively more complex, driven at least in part by the demand for smaller sizes and enhanced processing speeds. To support increased functionality, semiconductor device packages often include various devices or components configured for different functions, such as sensors, processors, and etc.

Currently, sensors and processors are disposed on a substrate and encapsulated to form a sensor package. However, such configuration creates a relatively large package thickness, which is disadvantageous to the reduction of package sizes and applications in wearable devices.

SUMMARY

In one or more embodiments, a semiconductor device package includes a carrier, a protective element, and a sensor device. The protective element encapsulates the carrier. The sensor device is embedded in the carrier and the protective element. The sensor device includes a sensing portion and a protective portion adjacent to the sensing portion, and the protective portion of the sensor device has a first surface exposed from the protective element and the carrier.

In one or more embodiments, a semiconductor device package includes a carrier, a sensor device, a first device, and a protective element. The carrier has a first surface and a second surface opposite to the first surface. The sensor device and the first device are embedded in the carrier. The protective element encapsulates the carrier, the sensor device, and the first device, wherein the first surface of the carrier, a surface of the sensor device, and a surface of the first device are exposed from a surface of the protective element.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

FIG. 7A, FIG. 7B, FIG. 7C, FIG. 7D, FIG. 7D1, and FIG. 7E illustrate various operations in a method of manufacturing a semiconductor device package in accordance with some embodiments of the present disclosure;

FIG. 8A, FIG. 8B, FIG. 8C, FIG. 8D, FIG. 8D1, and FIG. 8E illustrate various operations in a method of manufacturing a semiconductor device package in accordance with some embodiments of the present disclosure;

FIG. 10A, FIG. 10B, FIG. 10C, FIG. 10C1, FIG. 10D, and FIG. 10E illustrate various operations in a method of manufacturing a semiconductor device package in accordance with some embodiments of the present disclosure.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
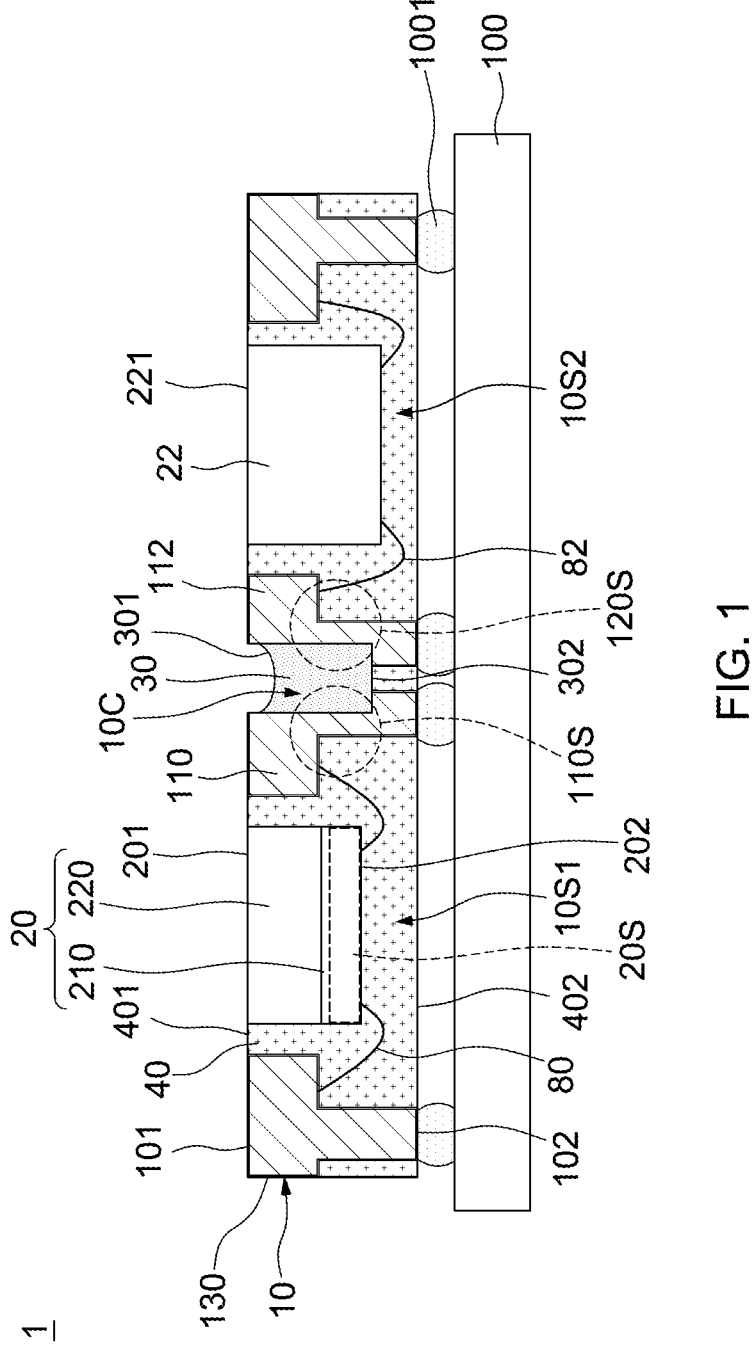
FIG. 1 is a cross-section of a semiconductor device package in accordance with some embodiments of the present disclosure.

FIG. 1 is a cross-section of a semiconductor device package 1 in accordance with some embodiments of the present disclosure. The semiconductor device package 1 includes a carrier 10, a substrate 100, electrical contacts 1001, devices 20 and 22, a blocking element 30, a protective element 40, and connection elements 80 and 82.

The carrier 10 may have a surface 101 and a surface 102 opposite to the surface 101. In some embodiments, the carrier 10 has one or more through holes (e.g., through holes 10S1 and 10S2) extending between the surface 101 and the surface 102 of the carrier 10. In some embodiments, the carrier 10 includes one or more stepped portions (e.g., stepped portions 110S and/or 120S) defining a recess 10C with respect to the surface 101 of the carrier 10. In some embodiments, the recess 10C is recessed from the surface 101 of the carrier 10 or the surface 102 of the carrier 10. In some embodiments, the carrier 10 includes a surface protection layer 130 at the surface 101 and/or the surface 102. In some embodiments, the surface protection layer 130 entirely covers the external surface of the carrier 10. In some embodiments, the carrier 10 includes a ceramic material or a metal plate. In some embodiments, the carrier 10 includes a substrate, such as an organic substrate or a leadframe. In some embodiments, the carrier 10 (or the leadframe) may include copper (Cu), copper alloy, iron/iron (Fe) alloy, nickel/nickel (Ni) alloy, or any other metal/metal alloy. The surface protection layer 130 may include Au/Ni, Au/Pd/Ni, or the like.

In some embodiments, the carrier 10 includes conductive portions (e.g., conductive portions 110 and 112) that are spaced apart from each other. In some embodiments, the conductive portion 110 is separated from the conductive portion 112. In some embodiments, the conductive portion 110 is spaced apart from the conductive portion 112. In some embodiments, the carrier 10 includes a plurality of the conductive portions 110 and a plurality of the conductive portions 112. In some embodiments, each of the conductive portions 110 and each of the conductive portions 112 includes a stepped portion. For example, each of the conductive portions 110 includes a stepped portion 110S, and each of the conductive portions 120 includes a stepped portion 120S. In some embodiments, the conductive portions 110 define or surround the through hole 10S1, and the conductive portions 120 define or surround the through hole 10S2. In some embodiments, the carrier 10 is a leadframe, and the conductive portions 110 and 112 are leads. In some embodiments, the carrier 10 is a leadframe without a die paddle for supporting the devices 20 and 22.

The substrate 100 may include, for example, a printed circuit board, such as a paper-based copper foil laminate, a composite copper foil laminate, or a polymer-impregnated glass-fiber-based copper foil laminate. The substrate 100 may include an interconnection structure, such as a plurality of conductive traces or a through via. In some embodiments, the substrate 100 includes a ceramic material or a metal plate. In some embodiments, the substrate 100 may include a two-layer substrate which includes a core layer and a conductive material and/or structure disposed on an upper surface and a bottom surface of the substrate 100. In some embodiments, the carrier 10 is disposed on the substrate 100. In some embodiments, the surface 102 of the carrier 10 is electrically connected to the substrate 100 through the electrical contacts 1001. In some embodiments, the electrical contacts 1001 may include controlled collapse chip connection (C4) bumps, a ball grid array (BGA) or a land grid array (LGA).

The device 20 may be embedded in the carrier 10. In some embodiments, the device 20 has a surface 201 exposed from the surface 101 of the carrier 10 and a surface 202 opposite to the surface 201. In some embodiments, the surface 201 of the device 20 substantially aligns to the surface 101 of the carrier 10. In some embodiments, the surface 201 of the device 20 is below the surface 101 of the carrier 10. In some embodiments, the device 20 is disposed in the through hole 10S1. In some embodiments, a vertical projection of the carrier 10 and a vertical projection of the device 20 are at least partially non-overlapping. In some embodiments, a vertical projection of the carrier 10 and a vertical projection of the device 20 are non-overlapping entirely. In some embodiments, the device 20 is electrically connected to the conductive portion 110 of the carrier 10. In some embodiments, the device 20 is electrically connected to the leads (e.g., the conductive portions 110) of the leadframe (e.g., the carrier 10). In some embodiments, the device 20 is a component such as an active component (e.g., including an integrated circuit (IC) chip or a die) or a passive component (e.g., including a capacitor, a resistor, or an inductor). In some embodiments, the device 20 is a sensor (e.g., an optical sensor, a MEMS sensor such as an IMU, or the like), a processing component (e.g., an ASIC die), an emitter, a receiver, or a combination thereof. In some embodiments, the device 20 is a signal receiver with a signal sensing region 20S at a side (e.g., the surface 202) away from the surface 101 of the carrier 10. In some embodiments, the device 20 is an optical sensor with a sensing region 20S at a side (e.g., the surface 202) away from the surface 101 of the carrier 10.

In some embodiments, the device 20 includes a sensing portion 210 and a protective portion 220 adjacent to the sensing portion 210. In some embodiments, the sensing portion 210 includes the sensing region 20S disposed at the surface 202 or exposed from the surface 202. In some embodiments, the surface 201 is configured to allow a light having a predetermined wavelength receivable by the sensing portion 210 of the device 20 to pass through. The light having a predetermined wavelength may be a light having optical wavelength(s) that can be received or absorbed by the sensing portion 210 of the device 20. In some embodiments, the surface 201 is configured to block or absorb a light having a wavelength different from the predetermined wavelength receivable by the sensing portion 210 of the device 20.

The device 22 may be embedded in the carrier 10. In some embodiments, the device 22 has a surface 221 exposed from the surface 101 of the carrier 10 and a surface 222 opposite to the surface 221. In some embodiments, the surface 221 of the device 22 substantially aligns to the surface 101 of the carrier 10. In some embodiments, the surface 221 of the device 22 is below the surface 101 of the carrier 10. In some embodiments, the device 22 is disposed in the through hole 10S2. In some embodiments, the device 22 is electrically connected to the conductive portion 112 of the carrier 10. In some embodiments, the device 22 is electrically connected to the leads (e.g., the conductive portions 112) of the leadframe (e.g., the carrier 10). In some embodiments, the device 20 and the device 22 are arranged side-by-side and surrounded by the carrier 10 (or the leadframe). In some embodiments, the device 20 and the device 22 are exposed from the surface 101 of the carrier 10 (or the leadframe). In some embodiments, the device 22 is a component such as an active component (e.g., including an integrated circuit (IC) chip or a die) or a passive component (e.g., including a capacitor, a resistor, or an inductor). In some embodiments, the device 22 is a sensor (e.g., an optical sensor, a MEMS sensor such as an IMU, or the like), a processing component (e.g., an ASIC die), an emitter, a receiver, or a combination thereof.

In some embodiments, the device 20 is a sensor, and the device 22 is an ASIC die configured to process sensing signal from the sensor. In some of such embodiments, the device 20 is electrically connected to the device 22. In some embodiments, the device 22 is an emitter, and the device 20 is a receiver (e.g., a sensor device) configured to receive an optical signal. In some embodiments, the device 20 includes a silicon layer, the sensing region 20S of the device 20 is configured to receive an IR signal, the received optical signal passes through the silicon layer before it reaches the sensing region 20S at a side away from the light receiving surface 201, and the silicon layer may serve as a filter to allow only the IR signal to reach the sensing region 20S.

The blocking element 30 may be embedded in the carrier 10. In some embodiments, the blocking element 30 is disposed in the recess 10C. In some embodiments, the blocking element 30 includes a gel opaque to optical wavelengths to be received by the device 20. In some embodiments, the blocking element 30 includes an epoxy opaque to optical wavelengths to be received by the device 20. In some embodiments, the blocking element 30 is a light blocking element. In some embodiments, the blocking element 30 is configured to block a light having optical wavelengths to be received by the device 20. In some embodiments, the blocking element 30 is configured to block a light from the device 22. In some embodiments, the blocking element 30 is configured to absorb a light to be received by the device 20. In some embodiments, the blocking element 30 may have a curved surface (e.g., surface 301). In some embodiments, the blocking element 30 may have a recessed surface (e.g., surface 301). In some embodiments, the blocking element 30 has a concave top surface 301. In some other embodiments, the top surface 301 may be convex or substantially planar (not shown in drawings). In some embodiments, the surface 301 of the blocking element 30 is exposed from the surface 101 of the carrier 10. In some embodiments, the blocking element 30 further has a surface 302 opposite to the surface 301 and embedded in the carrier 10. In some embodiments, the blocking element 30 is recessed from the surface 101 of the carrier 10. In some embodiments, the blocking element 30 is electrically disconnected to or isolated from the conductive portions 110 and the conductive portions 112 of the carrier 10. In some embodiments, the blocking element 30 may function as a reinforcing element connecting the conductive portion 110 and the conductive portion 112 of the carrier 10. In some embodiments, the blocking element 30 is between the device 20 and the device 22. In some embodiments, the blocking element 30 serving as a reinforcing element includes a light-blocking material and is between the device 20 and the device 22. In some embodiments, the blocking element 30 directly contacts the protective element 40 and the conductive portions 110 and 112 of the carrier 10.

The protective element 40 may be embedded in the carrier 10. In some embodiments, the protective element 40 has a surface 401 and a surface 402 opposite to the surface 401, and the surfaces 401 and 402 are exposed from the carrier 10. In some embodiments, the surface 101 of the carrier is exposed from the surface 401 of the protective element 40. In some embodiments, the surface 102 of the carrier 10 is exposed from the surface 402 of the protective element 40 to be electrically connected to the substrate 100. In some embodiments, the protective element 40 encapsulates the carrier 10, the device 20, and the device 22. In some embodiments, the devices 20 and 22 are embedded in the protective element 40. In some embodiments, the surface 401 of the protective element 40 is at a same side of the surface 101 of the carrier 10, and the surface 402 of the protective element 40 is at a same side of the surface 102 of the carrier 10. In some embodiments, the protective element 40 is disposed in the through holes 10S1 and 10S2. In some embodiments, the surface 401 of the protective element 40 substantially aligns to the surface 101 of the carrier 10. In some embodiments, the surface 401 of the protective element 40 substantially aligns to the surface 201 of the device 20. In some embodiments, the surface 401 of the protective element 40 substantially aligns to the surface 221 of the device 22. In some embodiments, the surface 101 of the carrier 10, the surface 201 of the device 20, and the surface 221 of the device 22 are exposed from the surface 401 of the protective element 40. In some embodiments, the surface 101 of the carrier 10, the surface 201 of the device 20, the surface 221 of the device 22, and the surface 401 of the protective element 40 are substantially level (or at substantially the same elevation). In some embodiments, the surface 402 of the protective element 40 substantially aligns to the surface 102 of the carrier 10. The protective element 40 may include an epoxy resin having fillers, a molding compound (e.g., an epoxy molding compound or other molding compound), polyimide, a phenolic compound or material, a material with a silicone dispersed therein, or a combination thereof.

In some embodiments, the device 20 is exposed from the surface 101 of the carrier 10 and the surface 401 of the protective element 40. In some embodiments, the protective portion 220 of the device 20 has a surface (e.g., the surface 201) exposed from the protective element 40 and the carrier 10. In some embodiments, a sensing range (or a sensing coverage) of the sensing portion 210 is defined by the surface 201 exposed from the protective element 40 and the carrier 10. For example, a light receiving range or angle may be defined by the surface 201 exposed from the protective element 40 and the carrier 10. For example, a field of view (FOV) may be defined by the surface 201 exposed from the protective element 40 and the carrier 10. In some embodiments, the device 20 is spaced apart from the carrier 10 by the protective element 40. In some embodiments, the device 20 is a signal receiver with a signal sensing region 20S at a side (e.g., the surface 202) away from the surface 401 of the protective element 40. In some embodiments, the sensing portion 210 is covered by the protective element 40. In some embodiments, the protective element 40 is configured to block a light to be received by the device 20. In some embodiments, the protective element 40 is configured to block a light that is not transmitting from the surface 201 to enter the sensing region 20S. In some embodiments, the device 22 is exposed from the surface 101 of the carrier 10 and the surface 401 of the protective element 40. In some embodiments, the device 22 is spaced apart from the carrier 10 by the protective element 40. In some embodiments, the blocking element 30 contacts the protective element 40. In some embodiments, the surface 302 of the blocking element 30 contacts the protective element 40.

The connection element 80 may be within the through hole 10S1 and electrically connect the device 20 to the carrier 10. In some embodiments, the connection element 80 is encapsulated by the protective element 40. In some embodiments, the connection element 80 electrically connects the conductive portion 110 of the carrier 10 to the device 20. In some embodiments, the connection element 80 electrically connects a sensing surface (e.g., the surface 202) of the device 20 to the stepped portion 110S of the carrier 10. The connection element 82 may be within the through hole 10S2 and electrically connect the device 22 to the carrier 10. In some embodiments, the connection element 82 is encapsulated by the protective element 40. In some embodiments, the connection element 82 electrically connects the conductive portion 112 of the carrier 10 to the device 20. In some embodiments, the connection element 82 electrically connects the device 22 to the stepped portion 120S of the carrier 10. In some embodiments, the connection element 80 contacts the surface protection layer 130 of the conductive portion 110 and the active surface (i.e., the surface 202) of the device 20, and the connection element 82 contacts the surface protection layer 130 of the conductive portion 112 and the active surface (i.e., the surface 222) of the device 22. The connection elements 80 and 82 may be formed of or include a conductive material such as a metal or metal alloy. Examples include gold (Au), silver (Ag), aluminum (Al), copper (Cu), or an alloy thereof. In some embodiments, the connection elements 80 and 82 are conductive wires.

In some cases where devices (or dies) are disposed on a die paddle of a leadframe and the combination of the devices and the leadframe are encapsulated by an encapsulant, the resulted package may have a relatively great thickness since the devices stacked with the die paddle are fully covered in the encapsulant. To solve the above issue, ultra-thin packages may be manufactured by forming through silicon vias (TSVs) penetrating a silicon wafer for electrical connection without using a substrate or a leadframe. However, TSVs process has its own thickness limitation, for example, semiconductor die cannot be thicker than 150 μm, and process-oriented limitations, for example, some devices (e.g., sensors with sensing areas) may be damaged by high-temperature processes and/or chemicals used in lithography processes in the manufacturing process for forming TSVs in the silicon wafer. In addition, it is difficult to integrate multiple devices (or dies) in the ultra-thin packages. Thinner package can also be obtained through additional grinding operations. However, grinding operations may easily damage the devices (e.g., sensing surfaces of sensors) and have relatively poor control over surface uniformity.

In contrast, according to some embodiments of the present disclosure, with the design of the devices 20 and 22 exposed from the carrier 10 and the protective element 40, the overall thickness of the semiconductor device package 1 can be defined by the thickness of the carrier 10 (or the leadframe) and thus can be reduced significantly. For example, the overall thickness of the semiconductor device package 1 can be reduced to below about 0.3 mm. In addition, according to some embodiments of the present disclosure, the devices 20 and 22 are encapsulated by the protective element 40 and electrically connected to the carrier 10 (or the leadframe), thus multiple devices 20 and 22 can be easily integrated in an ultra-thin semiconductor device package 1, and a grinding operation may be omitted to prevent the aforesaid issues of devices being damaged by the grinding operation and/or low surface uniformity.

Moreover, according to some embodiments of the present disclosure, with the conductive portions 110 structurally connected to the conductive portions 112 through the blocking element 30 which is filled in the recess 10C and serves as a reinforcing element, the weak point at the recess 10C between the conductive portions 110 and 120 of the semiconductor device package 1 is strengthened, and thus the robustness of the overall structure of the semiconductor device package is increased. Furthermore, according to some embodiments of the present disclosure, the blocking element 30 includes a material opaque to optical wavelengths to be received by the device 20, and thus the blocking element 30 can further reduce undesired optical interference between the device 20 and the device 22.

Figures 1A, 1B:
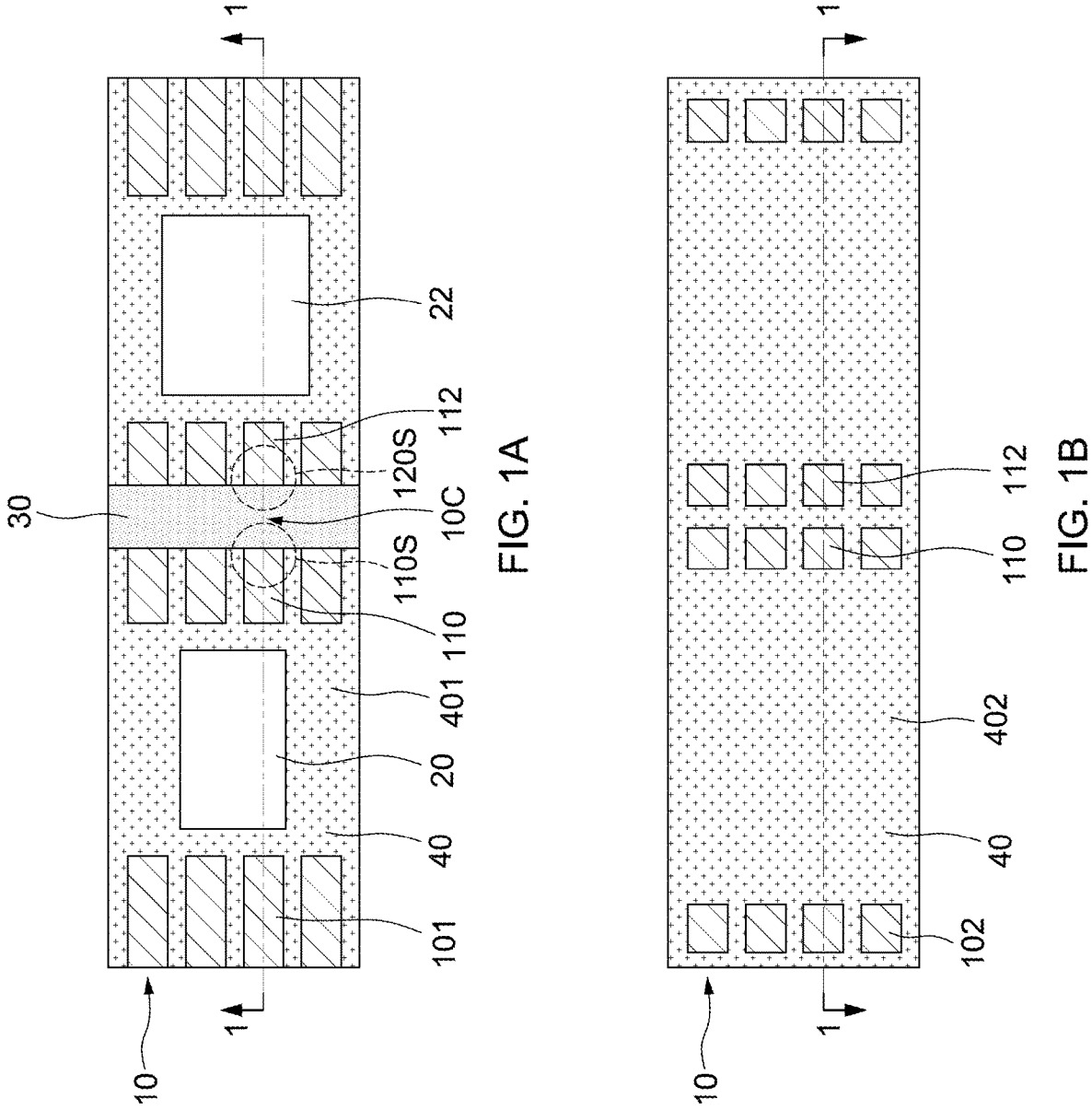
FIG. 1A is a top view of a semiconductor device package in accordance with some embodiments of the present disclosure.
FIG. 1B is a bottom view of a semiconductor device package in accordance with some embodiments of the present disclosure.

FIG. 1A is a top view of a semiconductor device package in accordance with some embodiments of the present disclosure, and FIG. 1B is a bottom view of a semiconductor device package in accordance with some embodiments of the present disclosure. In some embodiments, FIG. 1 is a cross-section along the cross-sectional line 1-1' in FIG. 1A and FIG. 1B.

In some embodiments, the carrier 10 includes a plurality of the conductive portions 110 (or the leads) around the device 20. In some embodiments, the carrier 10 includes a plurality of the conductive portions 112 (or the leads) around the device 22. In some embodiments, the blocking element 30 contacts the plurality of the conductive portions (e.g., the conductive portions 110 and 112). In some embodiments, the carrier 10 includes a plurality of the stepped portions (e.g., the stepped portions 110S and 120S of the conductive portions 110 and 112). In some embodiments, the stepped portions 110S and 120S define the recess 10. In some embodiments, the blocking element 30 contacts the plurality of the stepped portions 110S and 120S.

Figure 1C:
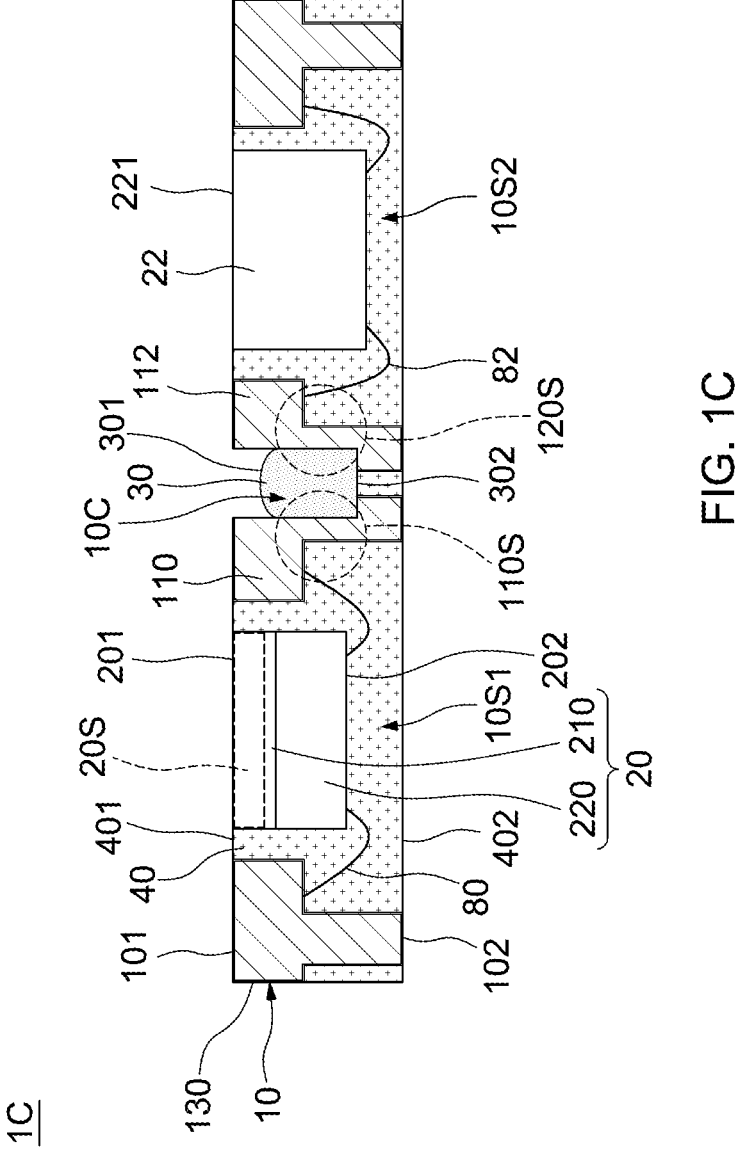
FIG. 1C is a cross-section of a semiconductor device package in accordance with some embodiments of the present disclosure.

FIG. 1C is a cross-section of a semiconductor device package 1C in accordance with some embodiments of the present disclosure. The semiconductor device package 1C is similar to the semiconductor device package 1 in FIG. 1, with differences therebetween as follows.

In some other embodiments, the device 20 is an optical sensor, and the sensing region 20S is exposed at a side (e.g., the surface 201) from the surface 101 of the carrier 10. In some embodiments, the device 22 is an emitter, and the device 20 is a receiver (e.g., a sensor device) configured to receive an optical signal. In some embodiments, an optical path of the optical signal may transmit from the emitter (e.g., device 22) and enter the sensing region 20S of the receiver or sensor (e.g. device 20) directly without passing additional dielectric layers. In some embodiments, a light emitted from the surface 221 of the device 22 is reflected by an object outside of the semiconductor device package passes through the surface 201 to enter the sensing region 20S. In some embodiments, the top surface 301 of the blocking element 30 may be convex or substantially planar (not shown in drawings) depending on the corresponding gel-application conditions.

Figures 2A, 2B:
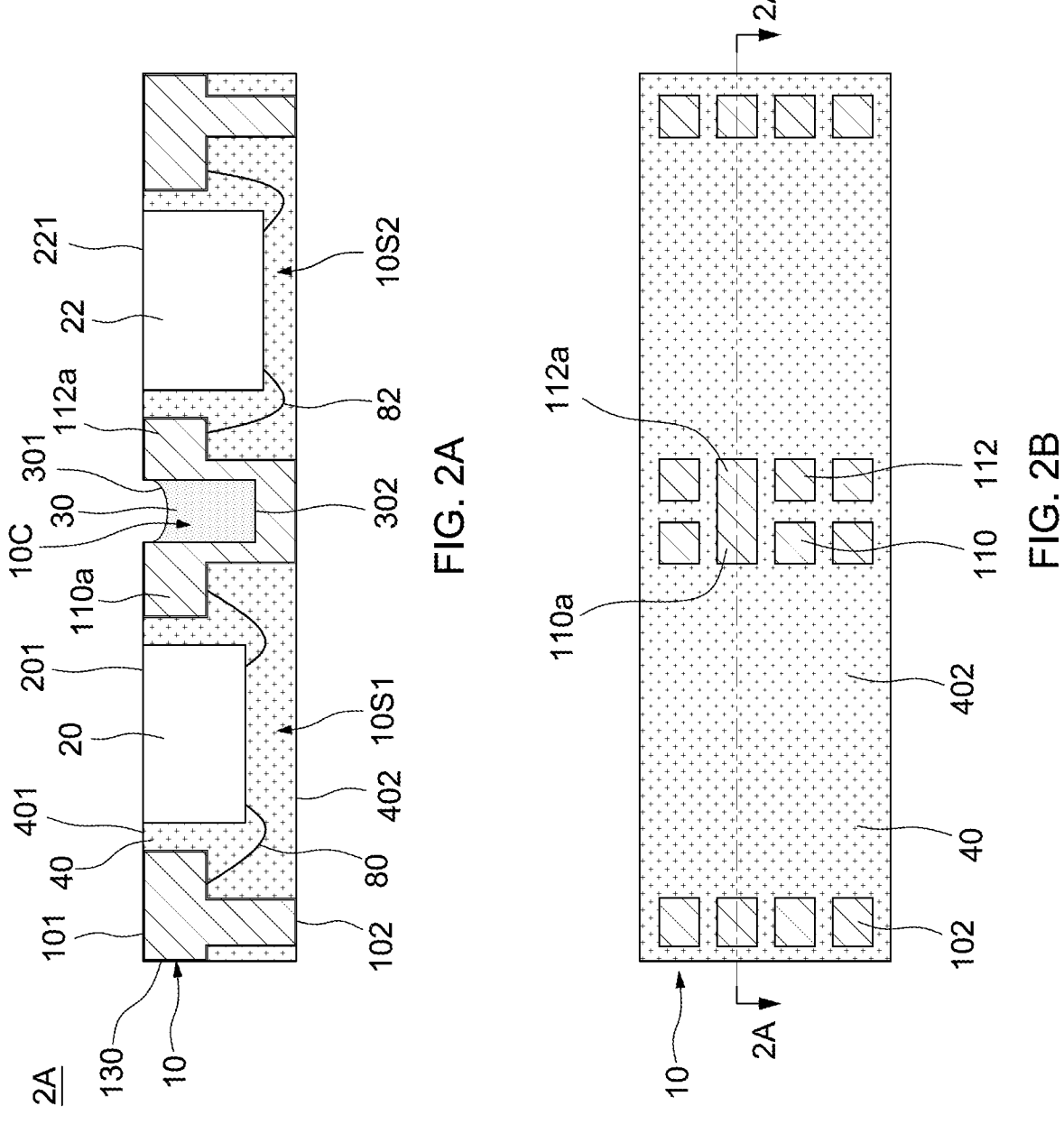
FIG. 2A is a cross-section of a semiconductor device package in accordance with some embodiments of the present disclosure.
FIG. 2B is a bottom view of a semiconductor device package in accordance with some embodiments of the present disclosure.

FIG. 2A is a cross-section of a semiconductor device package 2A in accordance with some embodiments of the present disclosure, and FIG. 2B is a bottom view of a semiconductor device package in accordance with some embodiments of the present disclosure. In some embodiments, FIG. 2A is a cross-section along the cross-sectional line 2A-2A' in FIG. 2B. The semiconductor device package 2A is similar to the semiconductor device package 1 in FIG. 1, with differences therebetween as follows.

In some embodiments, one of the conductive portions 110 (or the leads) directly contacts one of the conductive portions 112 (or the leads) to electrically connect the device 20 to the device 22. For example, the conductive portion 110a directly contacts the conductive portion 112a to electrically connect the device 20 to the device 22. In some embodiments, an interconnection portion between the conductive portion 110a (or the lead) and the conductive portion 112a (or the lead) is exposed from the surface 102 of the carrier 10. In some embodiments, the interconnection portion between the conductive portion 110a (or the lead) and the conductive portion 112a (or the lead) is exposed from the surface 402 of the protective element 40. In some embodiments, the conductive portion 110a (or the lead) and the conductive portion 112a (or the lead) define the recess 10C, and the blocking element 30 is in the recess 10C and exposed from the surface 101 of the carrier 10. In some embodiments, the device 20 is a signal receiver with a signal sensing region 20S at a side (e.g., the surface 202) away from the surface 101 of the carrier 10, and the device 22 is an emitter configured to emit a light that is to be received by the device 20.

Figures 2C, 2D:
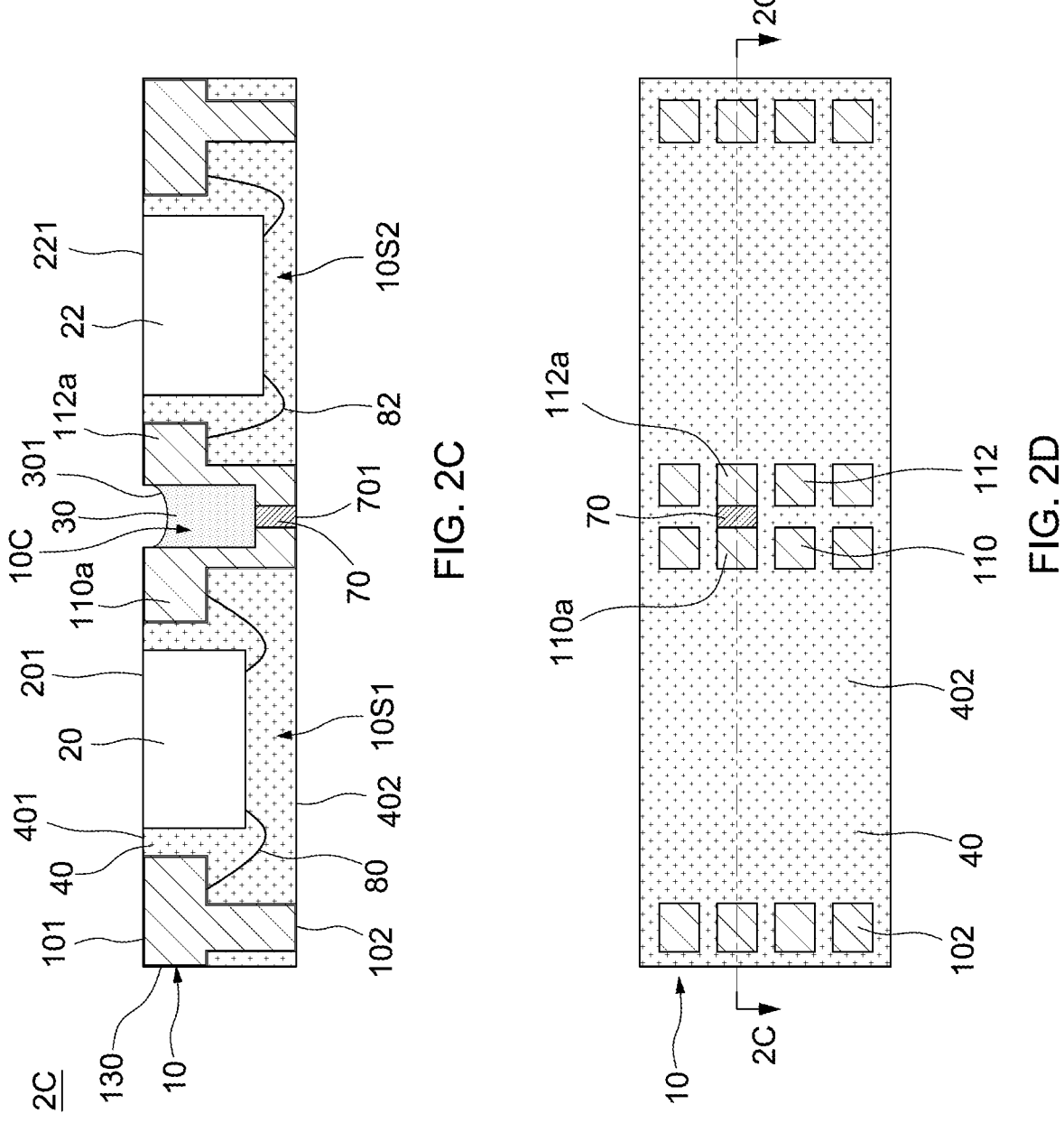
FIG. 2C is a cross-section of a semiconductor device package in accordance with some embodiments of the present disclosure.
FIG. 2D is a bottom view of a semiconductor device package in accordance with some embodiments of the present disclosure.

FIG. 2C is a cross-section of a semiconductor device package 2C in accordance with some embodiments of the present disclosure, and FIG. 2D is a bottom view of a semiconductor device package in accordance with some embodiments of the present disclosure. In some embodiments, FIG. 2C is a cross-section along the cross-sectional line 2C-2C' in FIG. 2D. The semiconductor device package 2C is similar to the semiconductor device package 1 in FIG. 1, with differences therebetween as follows.

In some embodiments, the semiconductor device package 2C further includes a conductive element 70 electrically connecting the conductive portion 110 to the conductive portion 112. In some embodiments, the conductive element 70 contacts the conductive portion 110a (or the lead) and the conductive portion 112a (or the lead). In some embodiments, the conductive element 70 has a surface 701 exposed from and substantially aligning to the surface 102 of the carrier 10. In some embodiments, the surface 701 of the conductive element 70 is exposed from and substantially aligning to the surface 402 of the protective element 40. In some embodiments, the conductive element 70 includes a conductive gel, a conductive paste, or the like.

Figure 2E:
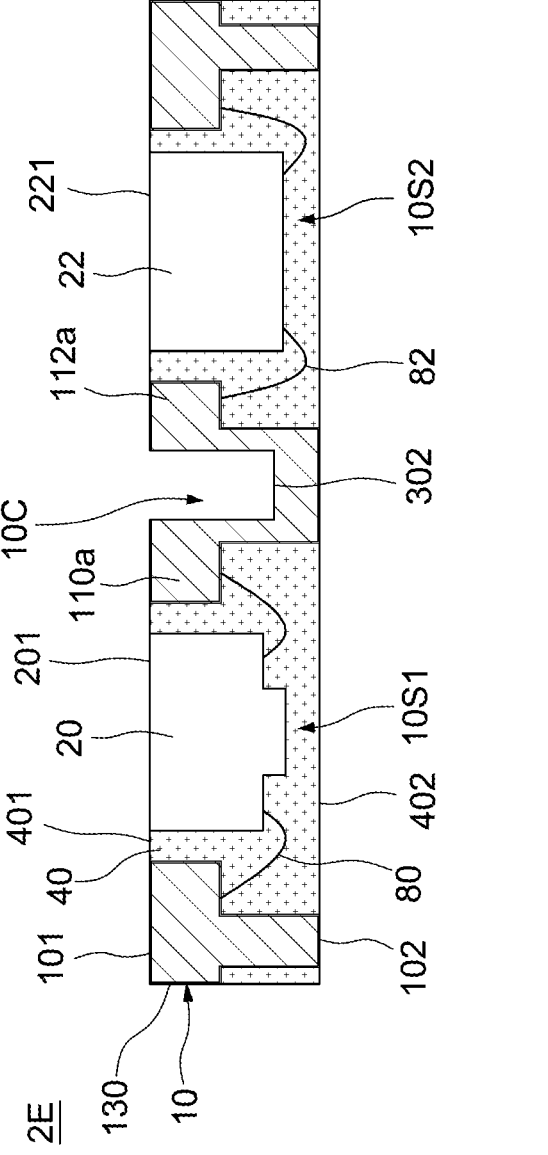
FIG. 2E is a cross-section of a semiconductor device package in accordance with some embodiments of the present disclosure.

FIG. 2E is a cross-section of a semiconductor device package 2E in accordance with some embodiments of the present disclosure. The semiconductor device package 2E is similar to the semiconductor device package 2A in FIG. 2A, with differences therebetween as follows.

In some embodiments, the device 20 is a sensor. In some embodiments, the device 20 is a sensor including stacked dies. In some embodiments, the device 20 is a MEMS sensor. For example, the device 20 is an acceleration sensor (e.g., an IMU). In some embodiments, the device 20 includes a die connected to a mass block through a flexible connector and another die including a cavity for accommodating the mass block. For example, the device 20 includes a protrusion towards the surface 402, and the protrusion includes the cavity for accommodating the mass block.

In some embodiments, the device 20 is a sensor, and the device 22 is an ASIC die configured to process sensing signal from the device 20. In some embodiments, the conductive portion 110a is electrically connected to the conducive portion 112a to electrically connect the device 22 to the device 20. In some embodiments, the semiconductor device package 1C does not include a blocking element in the recess 10C.

Figure 3:
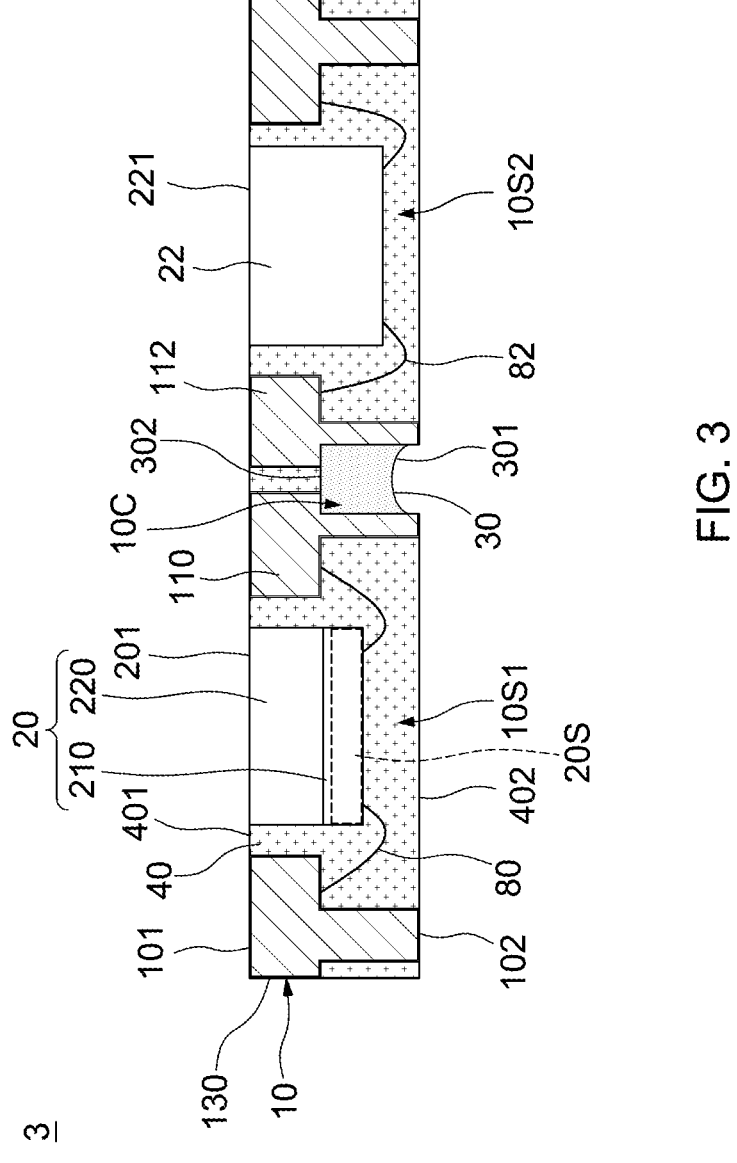
FIG. 3 is a cross-section of a semiconductor device package in accordance with some embodiments of the present disclosure.
Figures 3A, 3B:
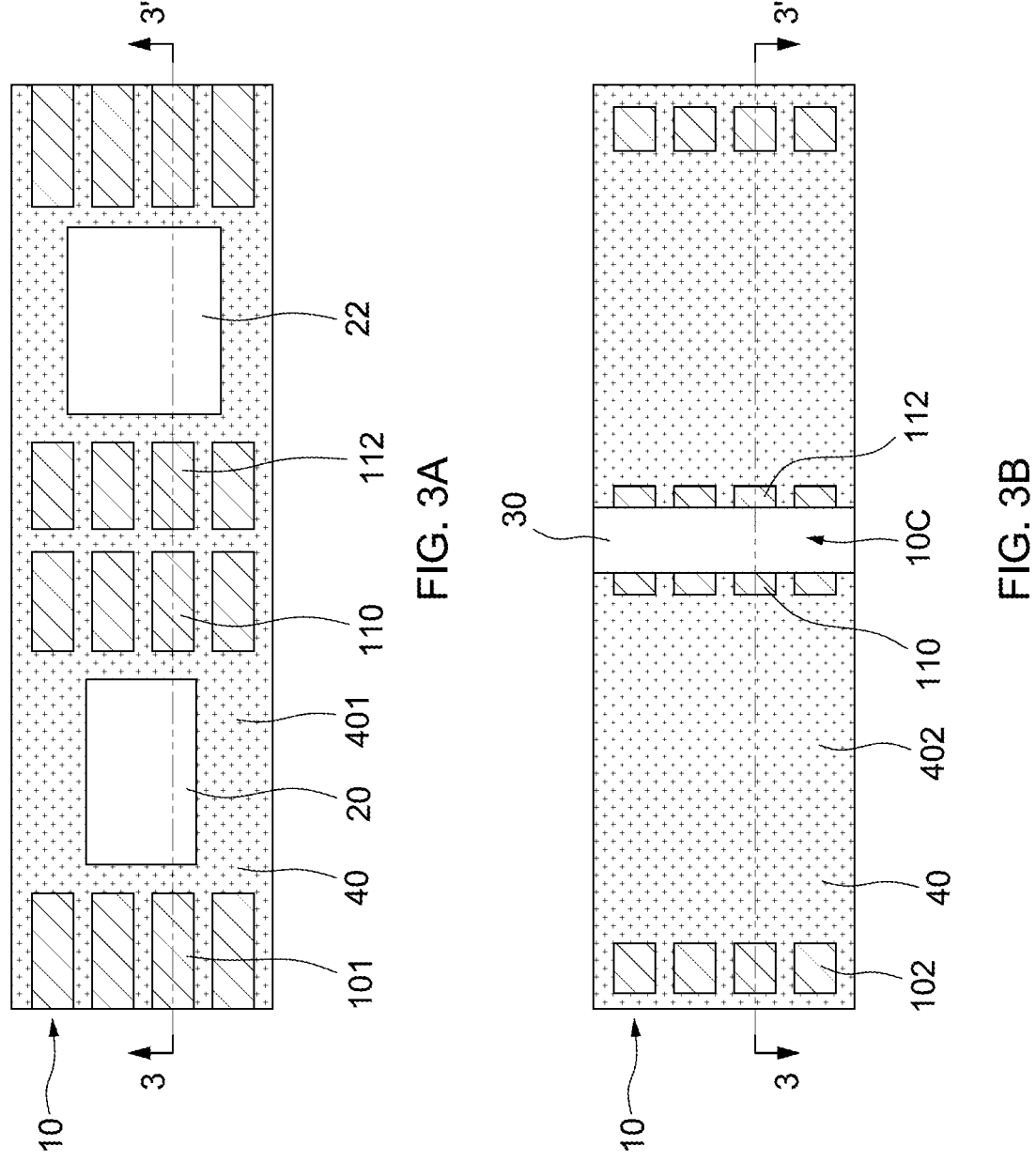
FIG. 3A is a top view of a semiconductor device package in accordance with some embodiments of the present disclosure.
FIG. 3B is a bottom view of a semiconductor device package in accordance with some embodiments of the present disclosure.

FIG. 3 is a cross-section of a semiconductor device package 3 in accordance with some embodiments of the present disclosure, FIG. 3A is a top view of a semiconductor device package in accordance with some embodiments of the present disclosure, and FIG. 3B is a bottom view of a semiconductor device package in accordance with some embodiments of the present disclosure. In some embodiments, FIG. 3 is a cross-section along the cross-sectional line 3-3' in FIG. 3A and FIG. 3B. The semiconductor device package 3 is similar to the semiconductor device package 1 in FIG. 1, with differences therebetween as follows.

In some embodiments, the surface 301 of the blocking element 30 is exposed from the surface 102 of the carrier 10. In some embodiments, the blocking element 30 is recessed from the surface 102 of the carrier 10. In some embodiments, the surface 301 of the blocking element 30 is exposed from the surface 102 of the carrier 10.

Figure 4A:
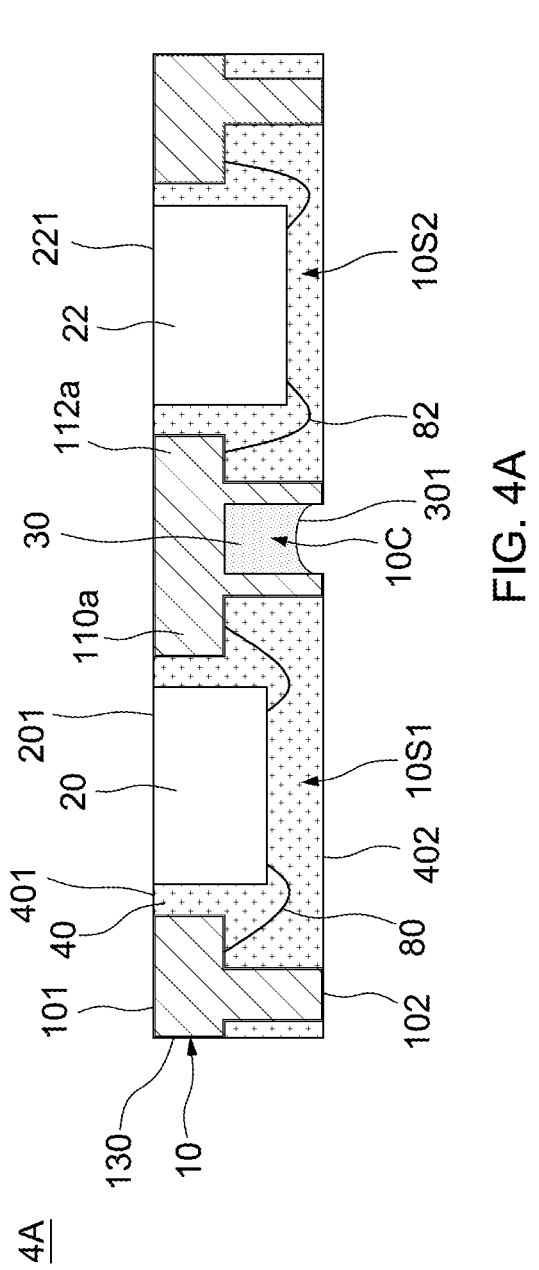
FIG. 4A is a cross-section of a semiconductor device package in accordance with some embodiments of the present disclosure.
Figure 4B:
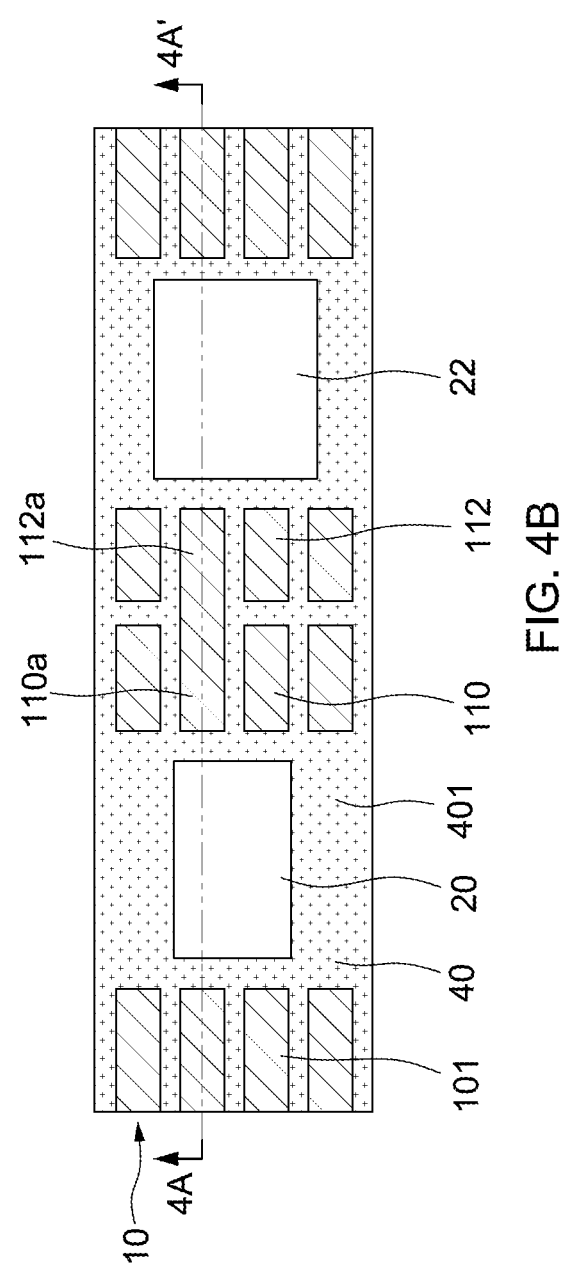
FIG. 4B is a top view of a semiconductor device package in accordance with some embodiments of the present disclosure.

FIG. 4A is a cross-section of a semiconductor device package 4A in accordance with some embodiments of the present disclosure, and FIG. 4B is a top view of a semiconductor device package in accordance with some embodiments of the present disclosure. In some embodiments, FIG. 4A is a cross-section along the cross-sectional line 4A-4A' in FIG. 4B. The semiconductor device package 4A is similar to the semiconductor device package 1 in FIG. 3, with differences therebetween as follows.

In some embodiments, one of the conductive portions 110 (or the leads) directly contacts one of the conductive portions 112 (or the leads) to electrically connect the device 20 to the device 22. For example, the conductive portion 110a directly contacts the conductive portion 112a to electrically connect the device 20 to the device 22. In some embodiments, an interconnection portion between the conductive portion 110a (or the lead) and the conductive portion 112a (or the lead) is exposed from the surface 101 of the carrier 10. In some embodiments, the interconnection portion between the conductive portion 110a (or the lead) and the conductive portion 112a (or the lead) is exposed from the surface 401 of the protective element 40. In some embodiments, the conductive portion 110a (or the lead) and the conductive portion 112a (or the lead) define the recess 10C, and the blocking element 30 is in the recess 10C and exposed from the surface 101 of the carrier 10. In some embodiments, the recess 10C is recessed from the surface 102 of the carrier 10.

Figures 4C, 4D:
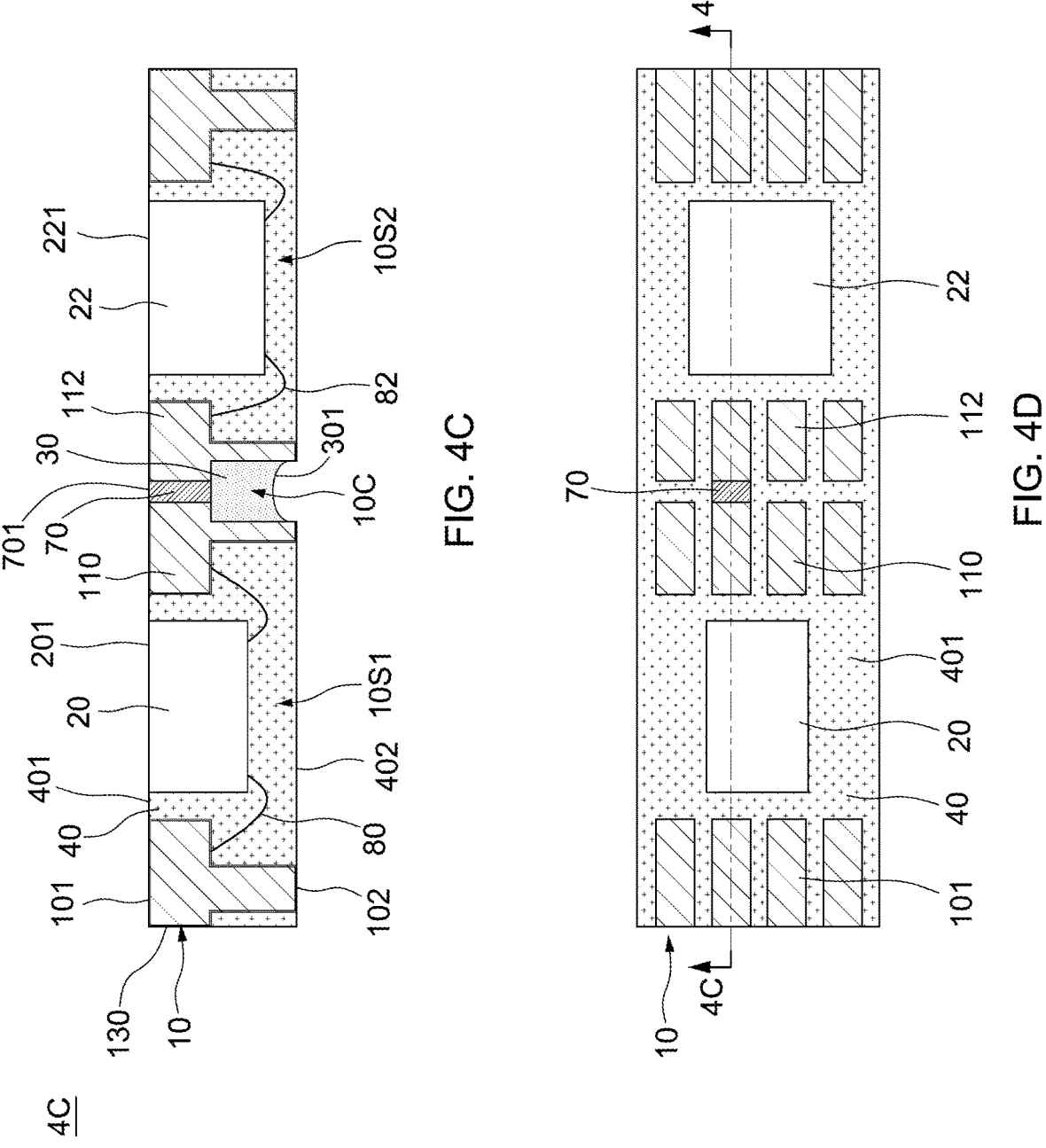
FIG. 4C is a cross-section of a semiconductor device package in accordance with some embodiments of the present disclosure.
FIG. 4D is a top view of a semiconductor device package in accordance with some embodiments of the present disclosure.

FIG. 4C is a cross-section of a semiconductor device package 4C in accordance with some embodiments of the present disclosure, and FIG. 4D is a top view of a semiconductor device package in accordance with some embodiments of the present disclosure. In some embodiments, FIG. 4C is a cross-section along the cross-sectional line 4C-4C' in FIG. 4D. The semiconductor device package 4C is similar to the semiconductor device package 1 in FIG. 3, with differences therebetween as follows.

In some embodiments, the semiconductor device package 4C further includes a conductive element 70 electrically connecting the conductive portion 110 to the conductive portion 112. In some embodiments, the conductive element 70 contacts the conductive portion 110a (or the lead) and the conductive portion 112a (or the lead). In some embodiments, the conductive element 70 has a surface 701 exposed from and substantially aligning to the surface 101 of the carrier 10. In some embodiments, the surface 701 of the conductive element 70 is exposed from and substantially aligning to the surface 401 of the protective element 40. In some embodiments, the conductive element 70 includes a conductive gel, a conductive paste, or the like.

In some embodiments, the blocking element 30 is embedded in the carrier 10 and between the device 20 and the device 22, and the blocking element 30 contacts the conductive element 70.

Figure 5:
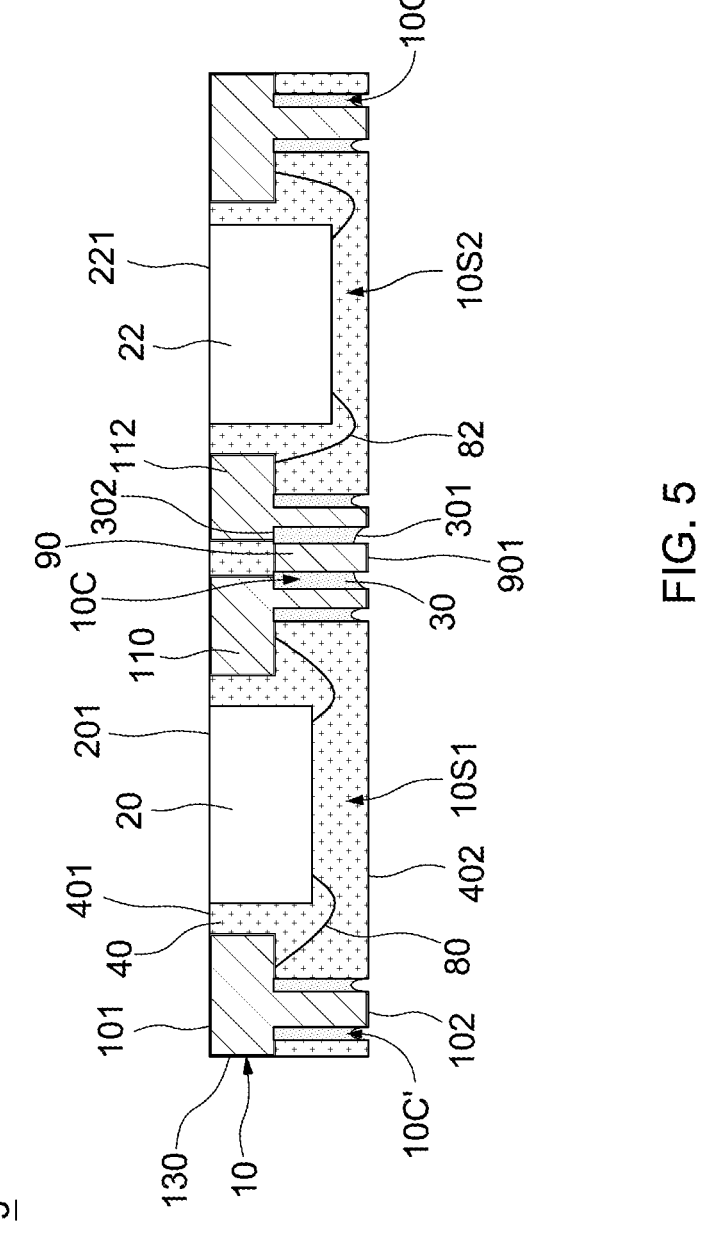
FIG. 5 is a cross-section of a semiconductor device package in accordance with some embodiments of the present disclosure.
Figures 5A, 5B:
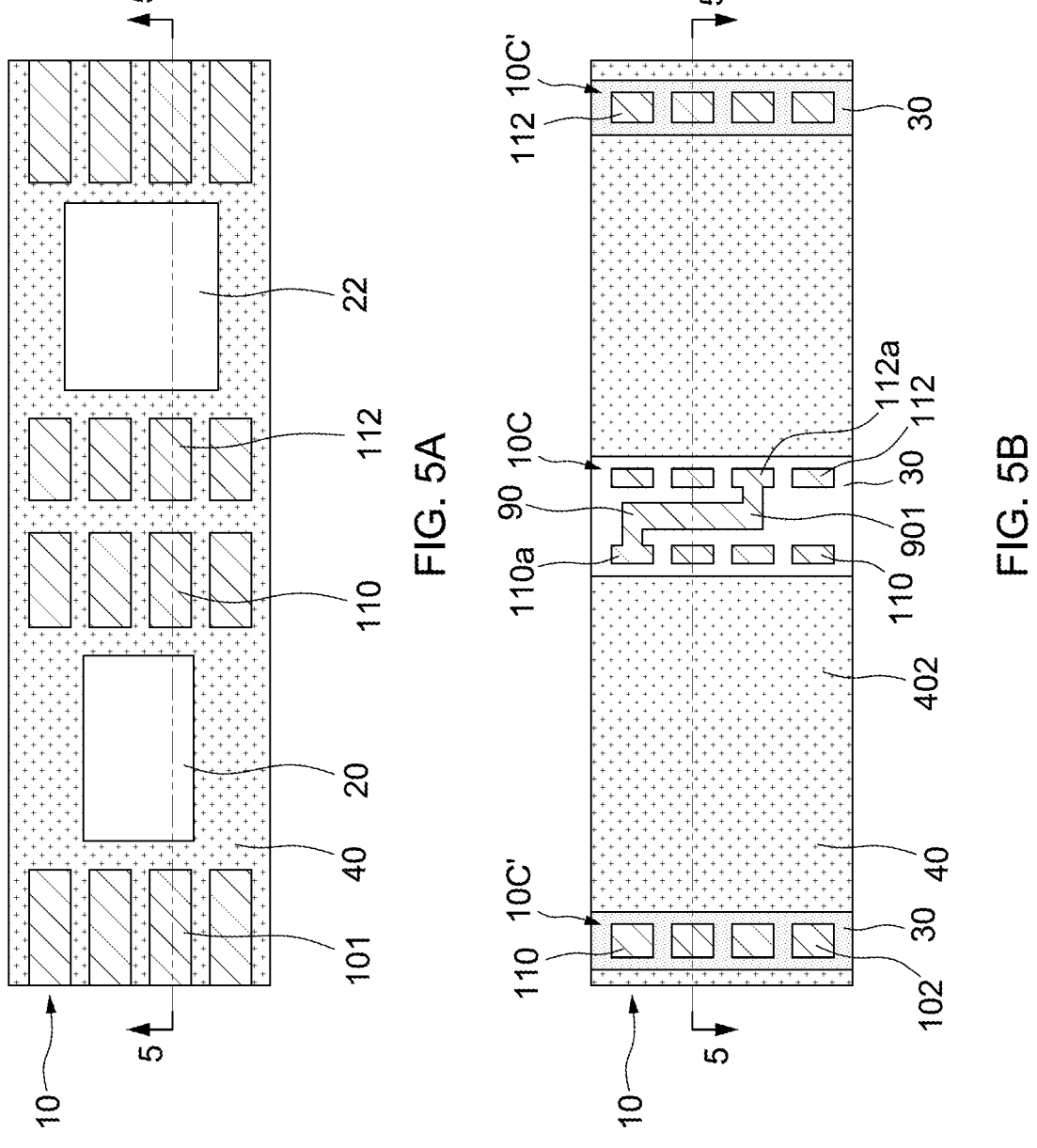
FIG. 5A is a top view of a semiconductor device package in accordance with some embodiments of the present disclosure.
FIG. 5B is a bottom view of a semiconductor device package in accordance with some embodiments of the present disclosure.

FIG. 5 is a cross-section of a semiconductor device package 5 in accordance with some embodiments of the present disclosure, FIG. 5A is a top view of a semiconductor device package in accordance with some embodiments of the present disclosure, and FIG. 5B is a bottom view of a semiconductor device package in accordance with some embodiments of the present disclosure. In some embodiments, FIG. 5 is a cross-section along the cross-sectional line 5-5' in FIG. 5A and FIG. 5B. The semiconductor device package 5 is similar to the semiconductor device package 3 in FIG. 3, with differences therebetween as follows.

In some embodiments, the semiconductor device package 5 further includes a conductive element 90 electrically connecting one of the conductive portions 110 (or the leads) to one of the conductive portions 112 (or the leads). For example, the conductive portion 110a (or the lead) is electrically connected to the conductive portion 112a (or the lead) through the conductive element 90, and the conductive portion 110a (or the lead) is laterally staggered from the conductive portion 112a (or the lead) in a planar view of the semiconductor device package 5. In some embodiments, the conductive element 90 includes a conductive pattern made of a portion of the carrier 10 (or the leadframe) and connecting the one of the conductive portions 110 (or the leads) to the one of the conductive portions 112 (or the leads). In some embodiments, the conductive element 90 has a surface 901 exposed from the protective element 40.

In some embodiments, the recess 10C is a patterned trench defined by the protective element 40 and the conductive element 90. In some embodiments, the blocking element 30 is disposed in the recess 10C. In some embodiments, the blocking element 30 is filled in the recess 10C. In some embodiments, the blocking element 30 encapsulates the conductive element 90 and the conductive portions 110 and 112. In some embodiments, the carrier 10 further includes one or more recesses 10C' spaced apart from the recess 10C. In some embodiments, the recesses 10C' are patterned trenches defined by the protective element 40 and the conductive portions 110 and 112. In some embodiments, the blocking element 30 is further disposed in the recesses 10C'.

Figure 5C:
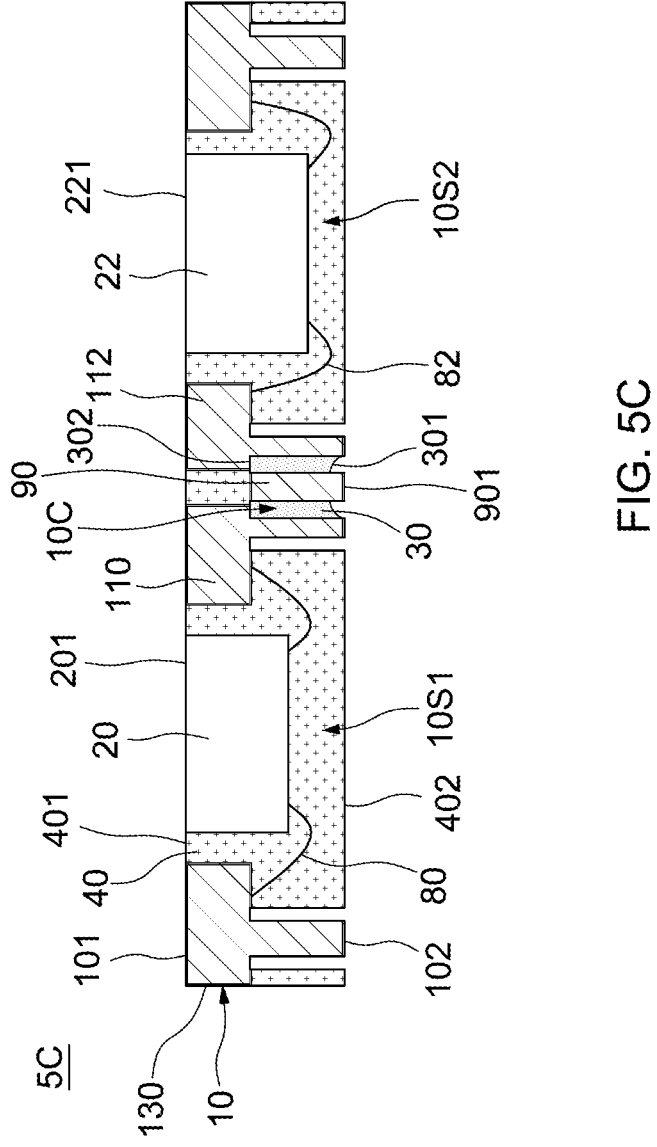
FIG. 5C is a cross-section of a semiconductor device package in accordance with some embodiments of the present disclosure.

FIG. 5C is a cross-section of a semiconductor device package 5C in accordance with some embodiments of the present disclosure. The semiconductor device package 5C is similar to the semiconductor device package 5 in FIG. 5, with differences therebetween as follows.

In some embodiments, the blocking element 30 is partially filled in the recess 10C. In some embodiments, the carrier 10 further includes recesses 10C'. In some embodiments, the recesses 10C' are defined by the protective element 40 and the conductive portions 110 and 112. In some embodiments, the recesses 10C' are free of a blocking element.

Figure 6:
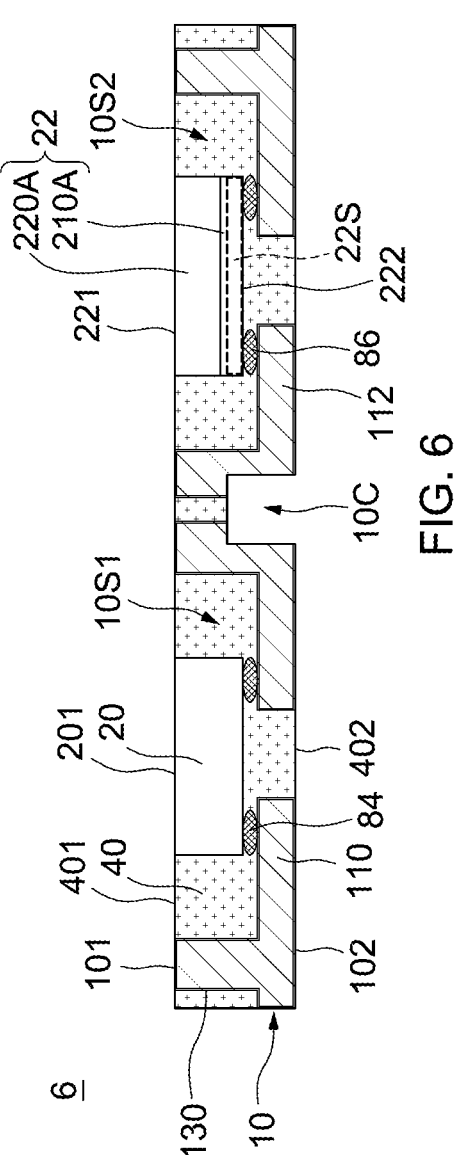
FIG. 6 is a cross-section of a semiconductor device package in accordance with some embodiments of the present disclosure.
Figure 6A:
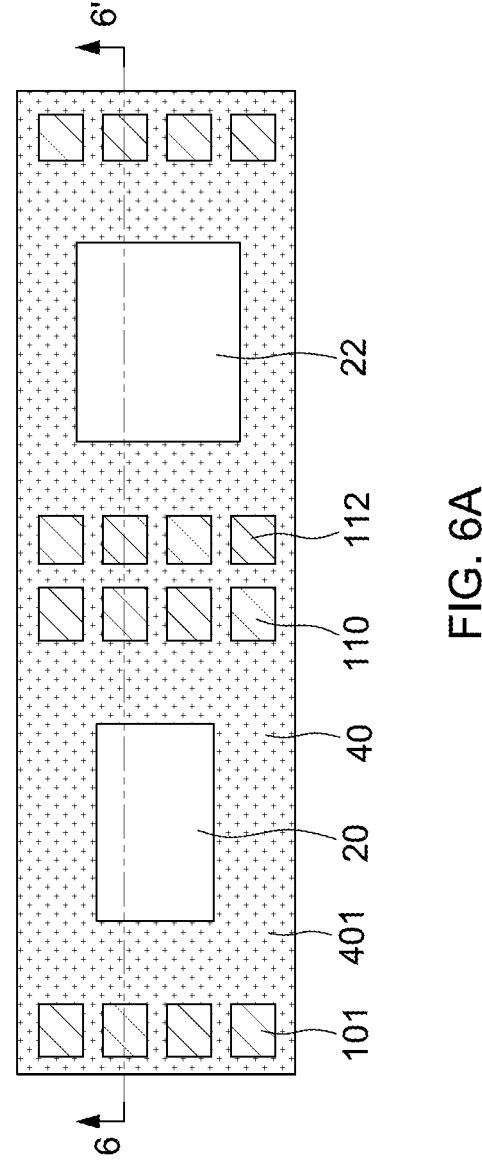
FIG. 6A is a top view of a semiconductor device package in accordance with some embodiments of the present disclosure.
Figure 6B:
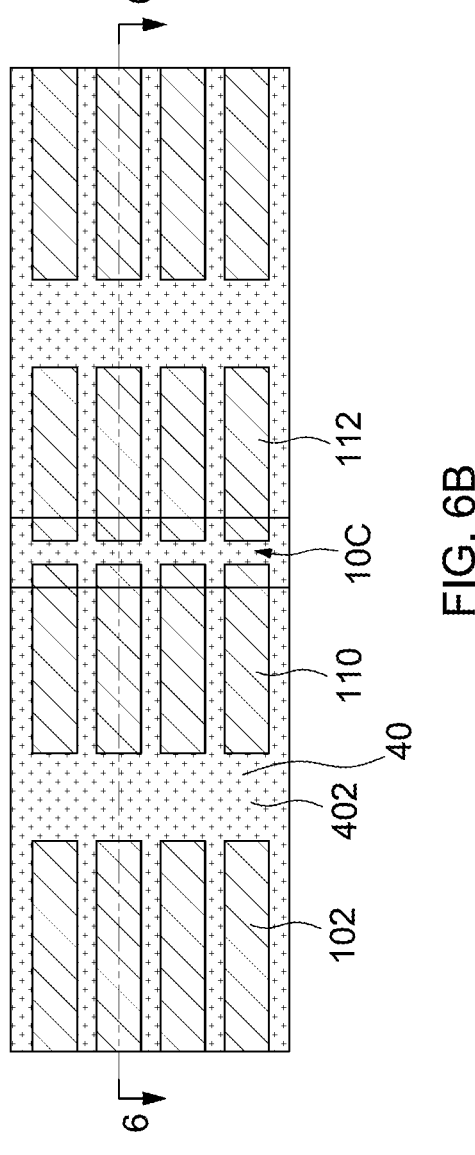
FIG. 6B is a bottom view of a semiconductor device package in accordance with some embodiments of the present disclosure.

FIG. 6 is a cross-section of a semiconductor device package 6 in accordance with some embodiments of the present disclosure, FIG. 6A is a top view of a semiconductor device package in accordance with some embodiments of the present disclosure, and FIG. 6B is a bottom view of a semiconductor device package in accordance with some embodiments of the present disclosure. In some embodiments, FIG. 6 is a cross-section along the cross-sectional line 6-6' in FIG. 6A and FIG. 6B. The semiconductor device package 6 is similar to the semiconductor device package 1 in FIG. 1, with differences therebetween as follows.

In some embodiments, the device 20 is electrically connected to the conductive portion 110 through a connection element 84 encapsulated by the protective element 40. In some embodiments, the device 22 is electrically connected to the conductive portion 112 through a connection element 86 encapsulated by the protective element 40. In some embodiments, the connection elements 84 and 86 may be or include a solder material.

In some embodiments, the device 20 is an emitter, and the device 22 is a receiver (or a sensor) configured to receive an optical signal. In some embodiments, the device 22 includes a signal sensing region 22S at a side (e.g., the surface 222) away from the surface 101 of the carrier 10. In some embodiments, the device 22 includes a sensing portion 210A and a protective portion 220A adjacent to the sensing portion 210A. In some embodiments, the sensing portion 210A includes the sensing region 22S. In some embodiments, an optical path of the optical signal entering the semiconductor device package 6 is by directly entering the device 22. In some embodiments, the optical path of the optical signal passes through the body of the device 22 and then reaches the sensing region 22S to be received.

FIG. 7A, FIG. 7B, FIG. 7C, FIG. 7D, FIG. 7D1, and FIG. 7E illustrate various operations in a method of manufacturing a semiconductor device package 1A in accordance with some embodiments of the present disclosure.

Figure 7A:
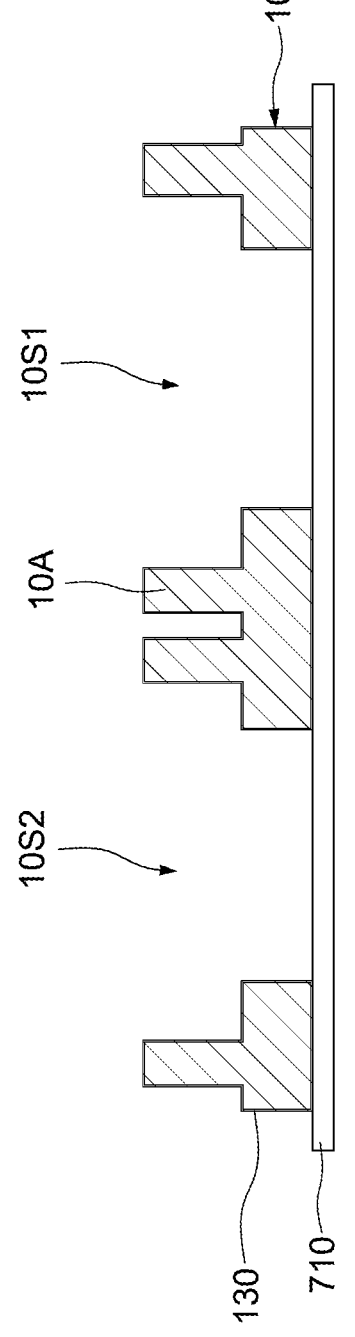

Referring to FIG. 7A, a carrier 10 including portions 10A that are separated from each other may be disposed on a carrier 710. In some embodiments, the carrier 10 includes a surface protection layer 130 covering the external surfaces of the portions 10A in order to passivate the surface of the carrier 10. In some embodiments, the portions 10A and the carrier 710 define through holes 10S1 and 10S2. In some embodiments, the surface protection layer 130 may be formed by plating. In some embodiments, the surface protection layer 130 can be a surface finish layer such as electroless nickel immersion gold (ENIG). In some embodiments, the carrier 10 is or includes a leadframe. In some embodiments, the carrier 710 is or includes a tape.

Figure 7B:
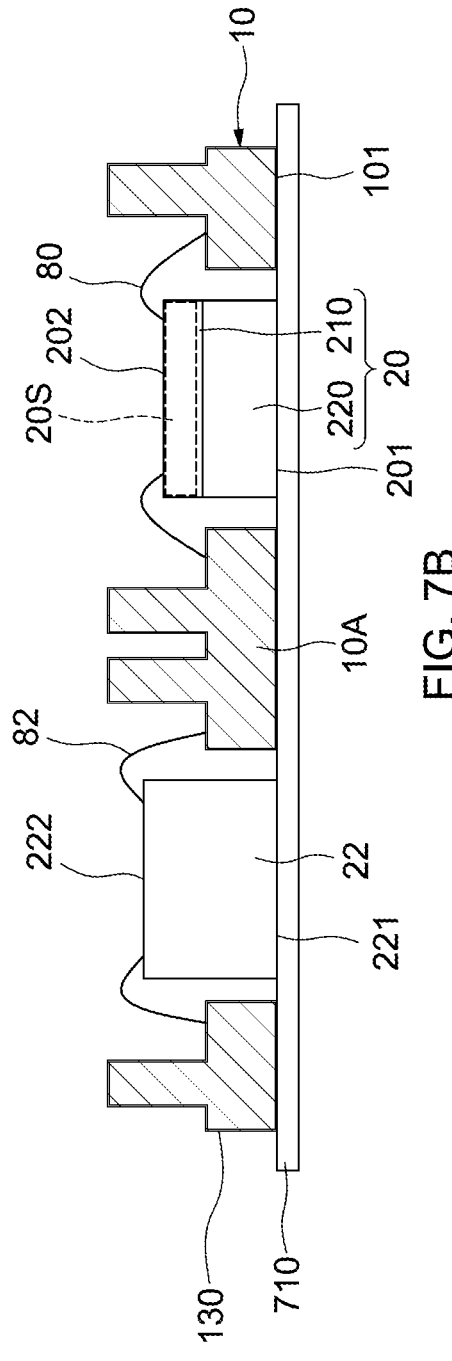

Referring to FIG. 7B, devices 20 and 22 may be disposed on the carrier 710 in the through holes 10S1 and 10S2, respectively, and the devices 20 and 22 may be wire bonded to the carrier 10 through conductive wires 80 and 82, respectively. In some embodiments, the conductive wire 80 contacts the surface protection layer 130 and the active surface (i.e., the surface 202) of the device 20, and the conductive wire 82 contacts the surface protection layer 130 and the active surface (i.e., the surface 222) of the device 22.

Figures 7C, 7D:
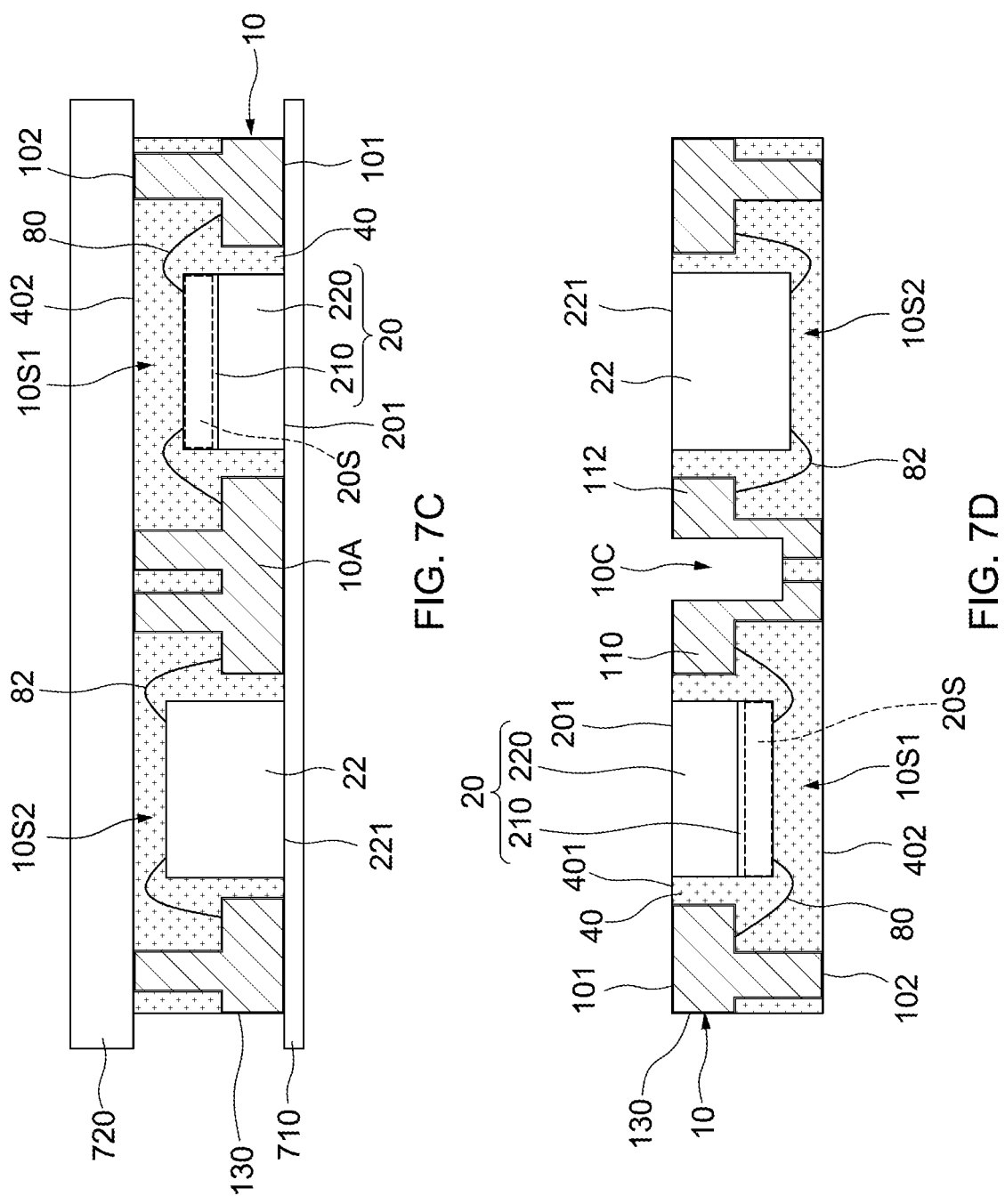

Referring to FIG. 7C, a temporary plate 720 may be disposed on the surface 102 of the carrier 10, and a protective material may be introduced into the space define by the carrier 710 and the temporary plate 720 to form a film type protective element 40. In some embodiments, the protective material may include an epoxy resin having fillers, a molding compound (e.g., an epoxy molding compound or other molding compound), polyimide, a phenolic compound or material, a material with a silicone dispersed therein, or a combination thereof. In some embodiments, a curing operation is performed on the protective material between the carrier 710 and the temporary plate 720 to form the protective element 40. According to some embodiments of the present disclosure, with the design of forming a film type protective element 40, a grinding operation may be omitted, and thus the surface uniformity can be improved without additional manufacturing operations or increased costs.

Referring to FIG. 7D and FIG. 7D1, FIG. 7D is a cross-section along the cross-sectional line 7D-7D' in FIG. 7D1. The carrier 710 and the temporary plate 720 may be removed, and a recess 10C may be formed from the surface 101 and extending into the carrier 10 to expose a portion of the protective element 40. In some embodiments, the recess 10C is formed between the device 20 and the device 22. In some embodiments, the recess 10C is formed by a mechanical cutting operation (e.g., a half-cut operation). In some embodiments, the recess 10C is formed to physically separate the portion 10A into separate conductive portions 110 and 112.

Figure 7E:
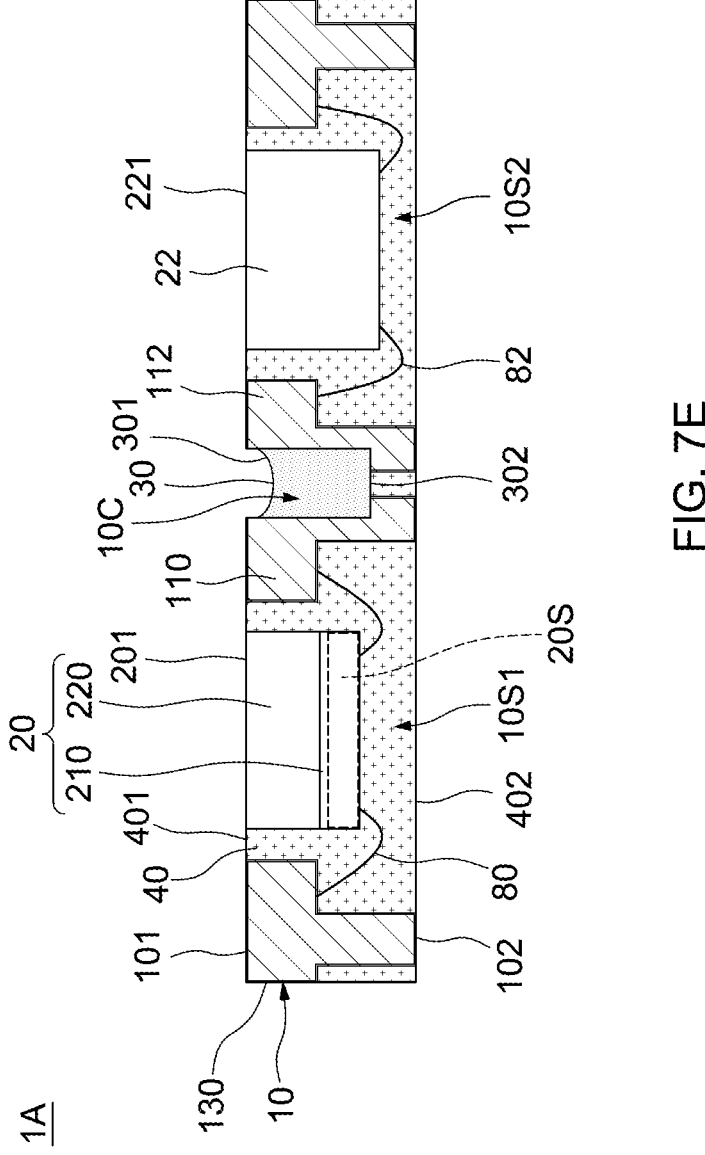

Referring to FIG. 7E, a blocking element 30 may be formed in the recess 10C. As such, the semiconductor device package 1A is formed. In some embodiments, the semiconductor device package 1A may be further bonded to a substrate 100 through electrical contacts 1001 to form the semiconductor device package 1 illustrated in FIG. 1.

Figure 8A:
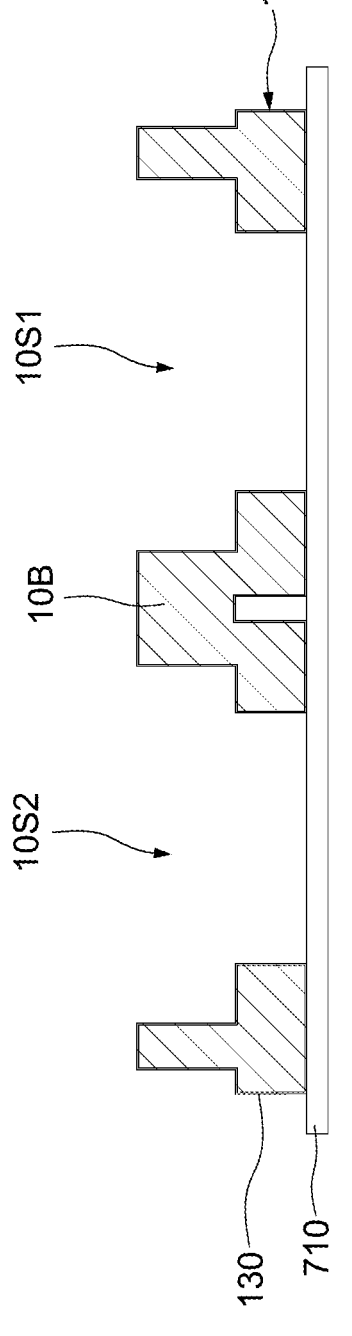

FIG. 8A, FIG. 8B, FIG. 8C, FIG. 8D, FIG. 8D1, and FIG. 8E illustrate various operations in a method of manufacturing a semiconductor device package in accordance with some embodiments of the present disclosure;

Referring to FIG. 8A, a carrier 10 including portions 10B that are separated from each other may be disposed on a carrier 710. In some embodiments, the carrier 10 includes a surface protection layer 130 covering the external surfaces of the portions 10B in order to passivate the surface of the carrier 10. In some embodiments, the portions 10B and the carrier 710 define through holes 10S1 and 10S2. In some embodiments, the surface protection layer 130 may be formed by plating. In some embodiments, the surface protection layer 130 can be a surface finish layer such as electroless nickel immersion gold (ENIG). In some embodiments, the carrier 10 is or includes a leadframe. In some embodiments, the carrier 710 is or includes a tape.

Figure 8B:
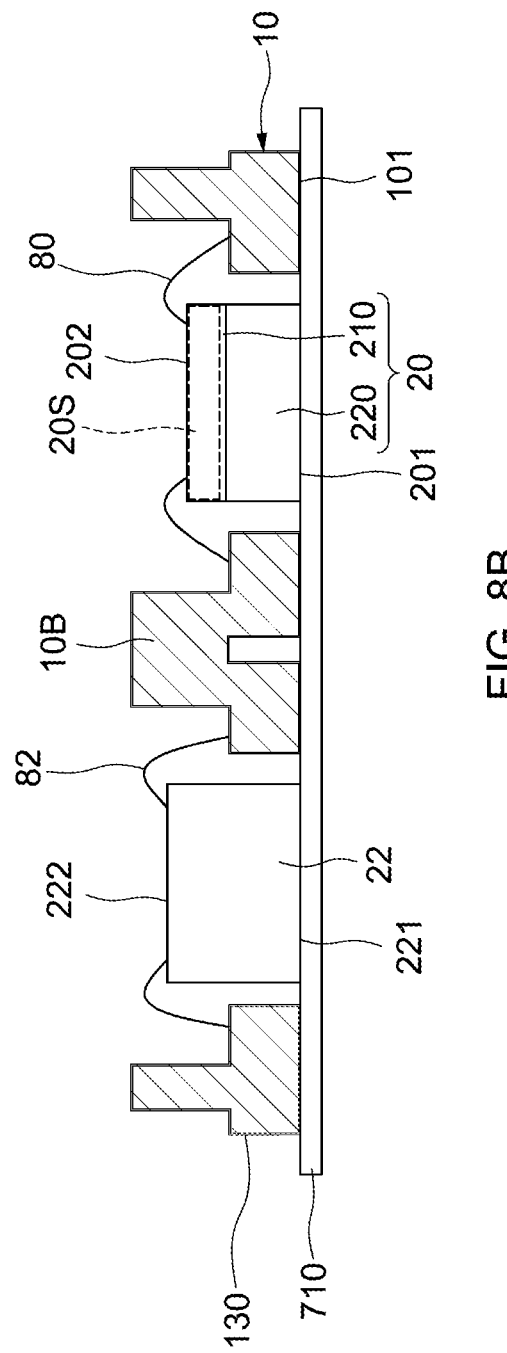

Referring to FIG. 8B, devices 20 and 22 may be disposed on the carrier 710 in the through holes 10S1 and 10S2, respectively, and the devices 20 and 22 may be wire bonded to the carrier 10 through conductive wires 80 and 82, respectively. In some embodiments, the conductive wire 80 contacts the surface protection layer 130 and the active surface (i.e., the surface 202) of the device 20, and the conductive wire 82 contacts the surface protection layer 130 and the active surface (i.e., the surface 222) of the device 22.

Figures 8C, 8D:
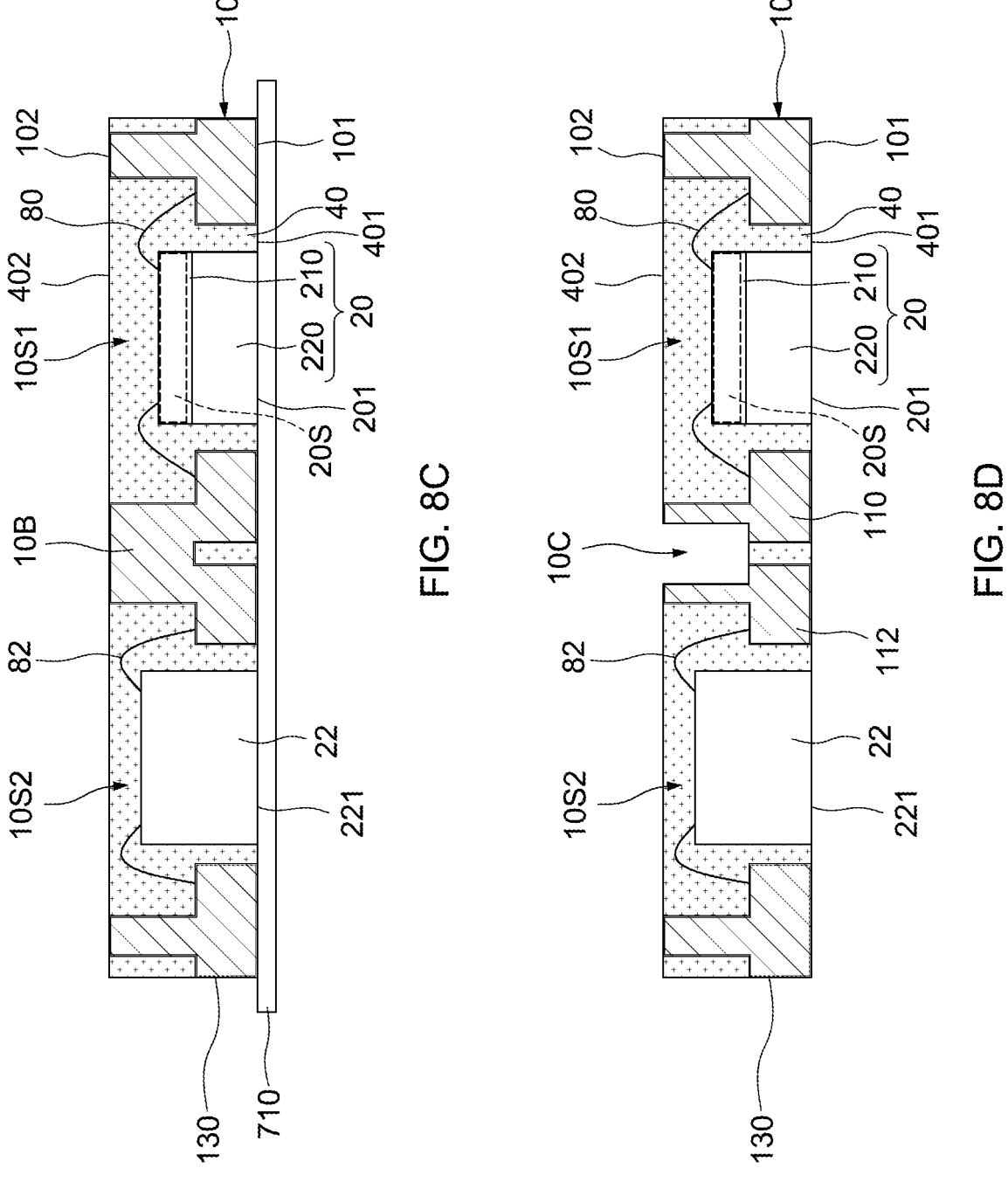

Referring to FIG. 8C, a protective element 40 may be formed to encapsulate the devices 20 and 22 and the conductive wires 80 and 82. In some embodiments, the protective element 40 partially encapsulates the portions 10B of the carrier 10.

Referring to FIG. 8D and FIG. 8D1, FIG. 8D is a cross-section along the cross-sectional line 8D-8D' in FIG. 8D1. A recess 10C may be formed from the surface 102 and extending into the carrier 10 to expose a portion of the protective element 40. In some embodiments, the recess 10C is formed between the device 20 and the device 22. In some embodiments, the recess 10C is formed by a mechanical cutting operation. In some embodiments, the recess 10C is formed to physically separate the portion 10B into separate conductive portions 110 and 112.

Figure 8E:
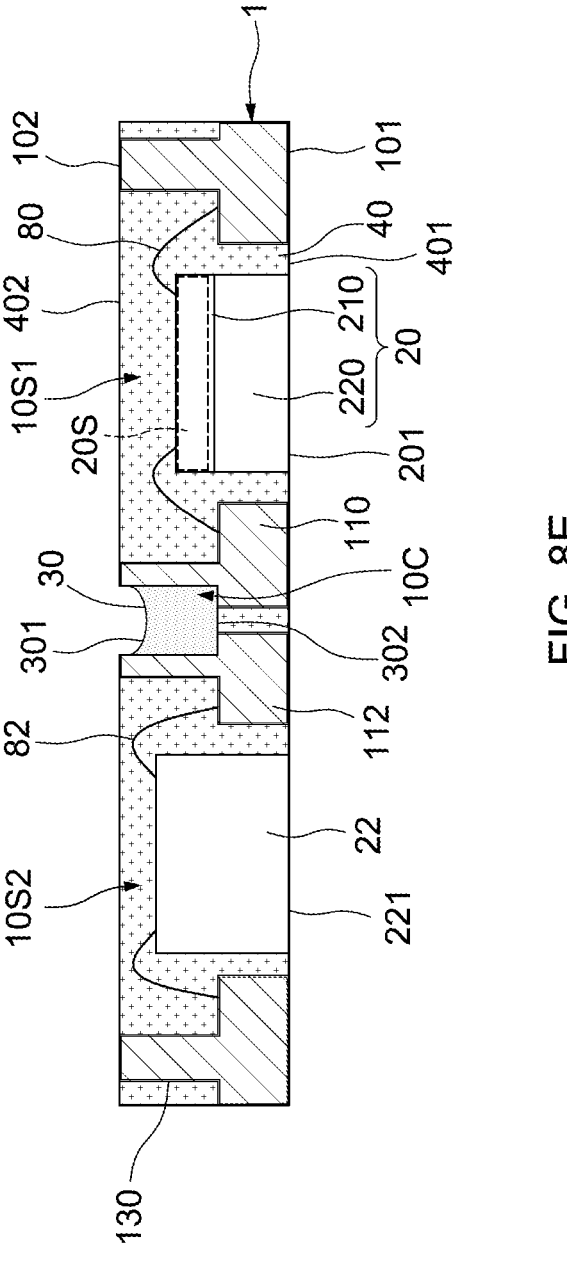

Referring to FIG. 8E, a blocking element 30 may be formed, by suitable gel-dispensing or gel-application processes, in the recess 10C. As such, the semiconductor device package 3 is formed.

Figure 9A:
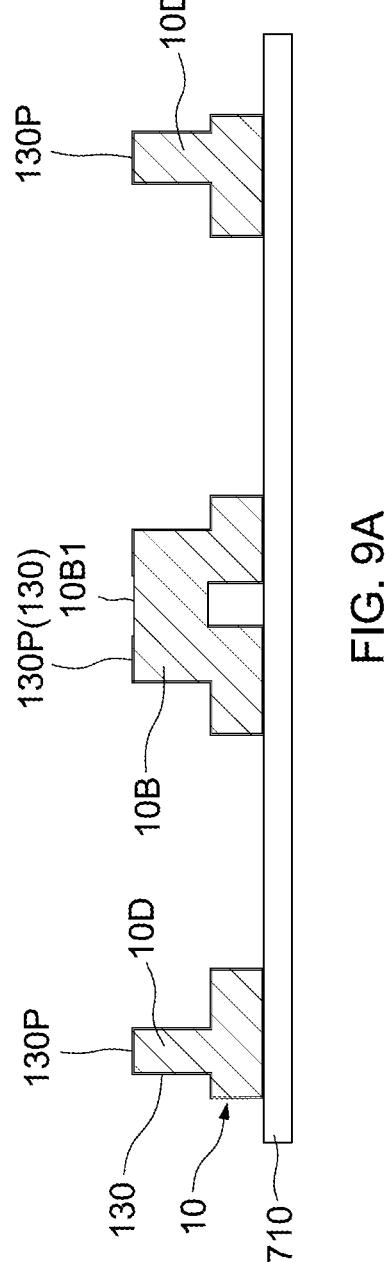
FIG. 9A and FIG. 9B illustrate various operations in a method of manufacturing a semiconductor device package in accordance with some embodiments of the present disclosure.
Figure 9B:
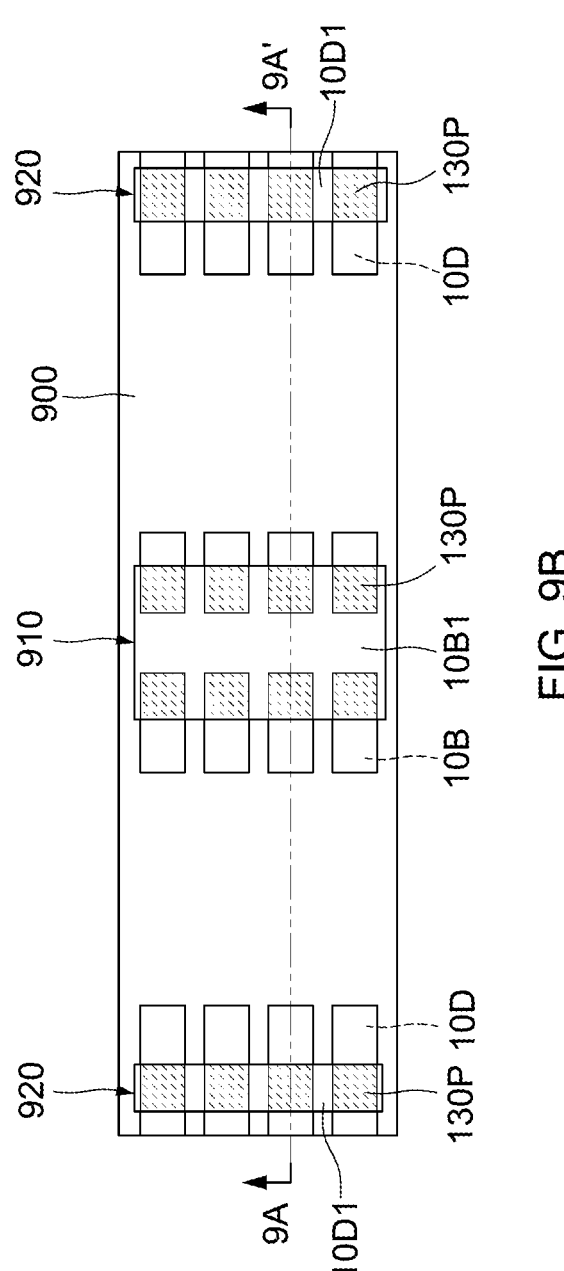

FIG. 9A and FIG. 9B illustrate various operations in a method of manufacturing a semiconductor device package 3 in accordance with some embodiments of the present disclosure.

Referring to FIGS. 9A-9B, FIG. 9A is a cross-section along the cross-sectional line 9A-9A' in FIG. 9B. A carrier 10 including portions 10B and 10D that are separated from each other may be disposed on a carrier 710. In some embodiments, as shown in FIG. 9B, each of the portions 10B and 10D includes a monolithic block having protrusions extending outwards. In some embodiments, each of the portions 10B and 10D includes a plurality of parts (or leads) connected to each other.

Still referring to FIGS. 9A-9B, a surface protection layer 130 may be formed to partially cover the external surfaces of the portions 10B and 10D. In some embodiments, a portion of the surface 10B1 of the portion 10B is exposed from patterns 130P of the surface protection layer 130. In some embodiments, portions of the surfaces 10D1 of the portions 10D are exposed from the patterns 130P of the surface protection layer 130. In some embodiments, the patterns 130P cover portions of the portions 10B and 10D that are predetermined to form conductive portions 110 and 112.

In some embodiments, operations similar to those illustrated in FIGS. 8B-8C may be performed to dispose devices 20 and 22 on the carrier 710, wire bond the devices 20 and 22 to the carrier 10, and encapsulate the devices 20 and 22 by a protective element 40.

Next, referring back to FIG. 9B, a mask layer 900 having openings 910 and 920 may be disposed over the portions 10B and 10D of the carrier 10. In some embodiments, portions of the patterns 130P are exposed from the openings 910 and 920. In some embodiments, a portion of the exposed surface 10B1 of the portion 10B is exposed from the opening 910. In some embodiments, portions of the exposed surfaces 10D1 of the portions 10D are exposed from the openings 920. In some embodiments, an etching operation may be performed to partially remove the portions 10B and 10D to form a recess 10C and conductive portions 110 and 112, as shown in FIGS. 8D and 8D1. In some embodiments, the etching operation is performed on portions of the portions 10B and 10D that are exposed from the patterns 130P.

Following FIG. 9A and FIG. 9B, a blocking element 30 may be formed in the recess 10C, as previously described in FIG. 8E. As such, the semiconductor device package 3 is formed.

FIG. 10A, FIG. 10B, FIG. 10C, FIG. 10C1, FIG. 10D, and FIG. 10E illustrate various operations in a method of manufacturing a semiconductor device package 5C in accordance with some embodiments of the present disclosure.

Figure 10A:
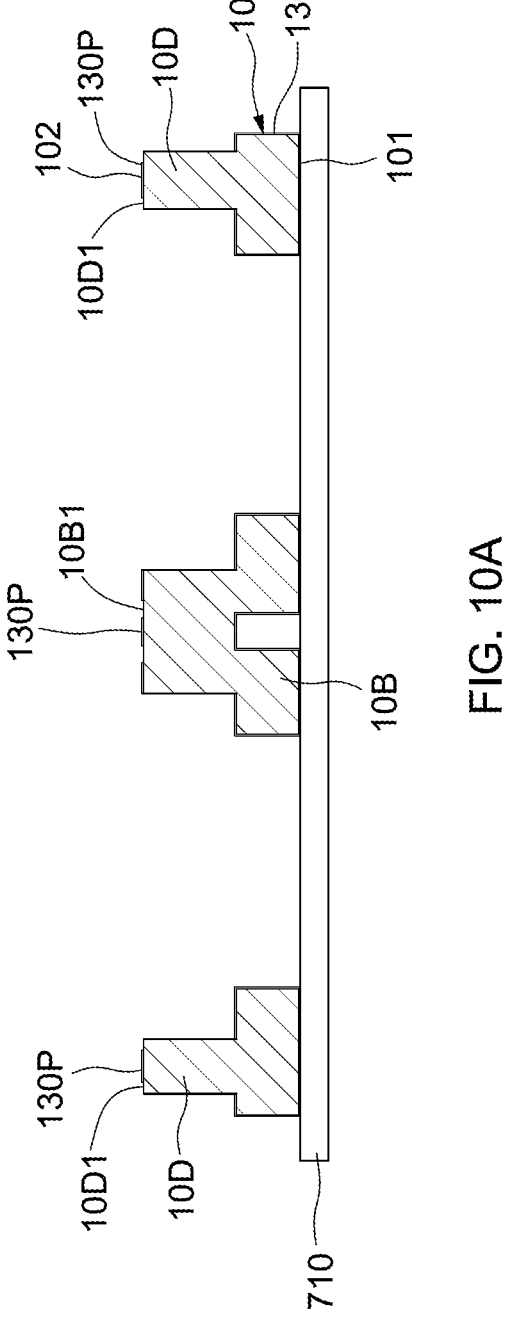

Referring to FIG. 10A, a carrier 10 including portions 10B and 10D that are separated from each other may be disposed on a carrier 710. In some embodiments, referring to FIGS. 9A-9B, each of the portions 10B and 10D includes a monolithic block having protrusions extending outwards. In some embodiments, each of the portions 10B and 10D includes a plurality of parts (or leads) connected to each other.

Still referring to FIG. 10A, a surface protection layer 130 may be formed to partially cover the external surfaces of the portions 10B and 10D. In some embodiments, a portion of the surface 10B1 of the portion 10B is exposed from patterns 130P of the surface protection layer 130. In some embodiments, portions of the surfaces 10D1 of the portions 10D are exposed from the patterns 130P of the surface protection layer 130. In some embodiments, the patterns 130P cover portions of the portions 10B and 10D that are predetermined to form conductive portions 110 and 112 and a conductive element 90. In some embodiments, a top view of the patterns 130P is shown in FIG. 10C1.

Figure 10B:
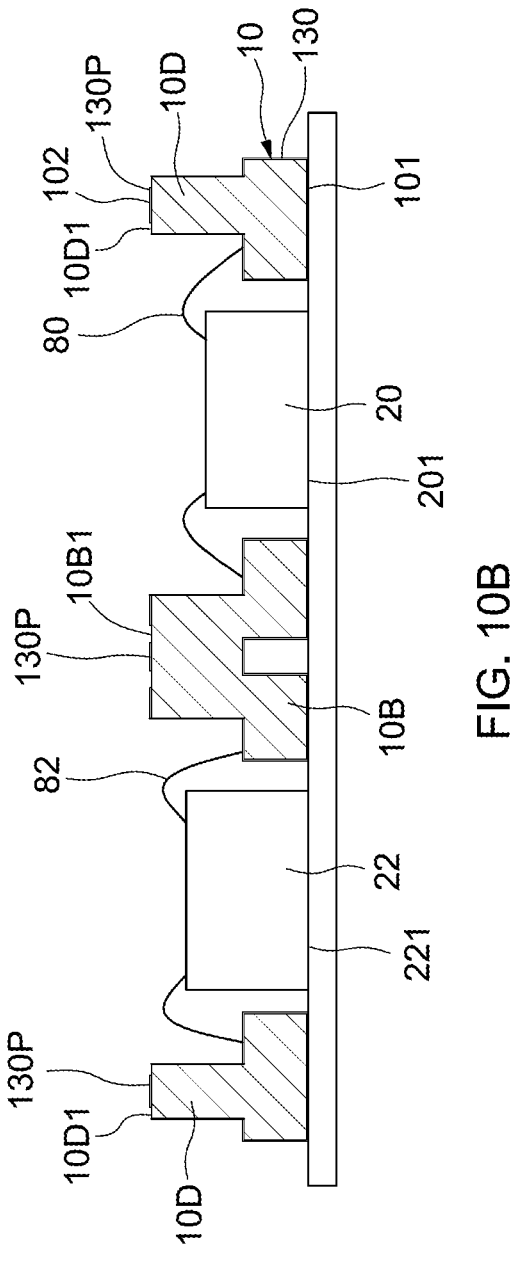

Referring to FIG. 10B, devices 20 and 22 may be disposed on the carrier 710, and the devices 20 and 22 may be bonded to the carrier 10 by conductive wires 80 and 82, respectively.

Referring to FIGS. 10C and 10C1, FIG. 10C is a cross-section along the cross-sectional line 10C-10C' in FIG. 10C1. The devices 20 and 22 and the conductive wires 80 and 82 may be encapsulated by a protective element 40. In some embodiments, the portions 10B and 10D of the carrier 10 are partially encapsulated by the protective element 40. In some embodiments, as shown in FIG. 10C1, a mask layer 1000 having openings 1010 and 1020 may be disposed over the portions 10B and 10D of the carrier 10. In some embodiments, portions of the patterns 130P are exposed from the openings 1010 and 1020. In some embodiments, a portion of the exposed surface 10B1 of the portion 10B is exposed from the opening 1010. In some embodiments, portions of the exposed surfaces 10D1 of the portions 10D are exposed from the openings 1020.

Figure 10D:
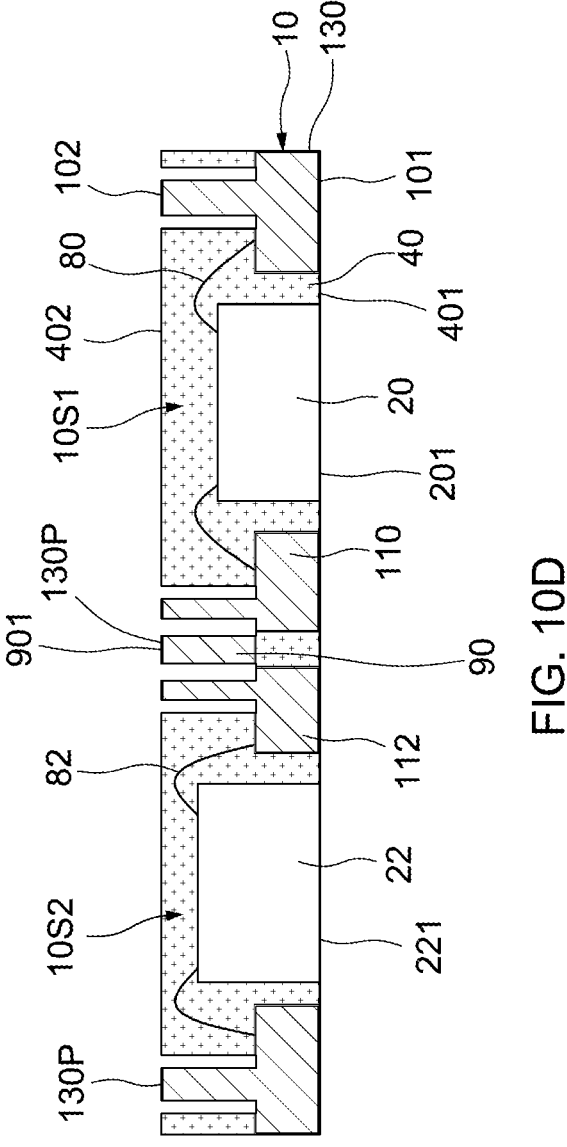

Referring to FIG. 10D, an etching operation may be performed to partially remove the portions 10B and 10D to form a recess 10C and conductive portions 110 and 112. In some embodiments, the etching operation is performed on portions of the portions 10B and 10D that are exposed from the patterns 130P.

Figure 10E:
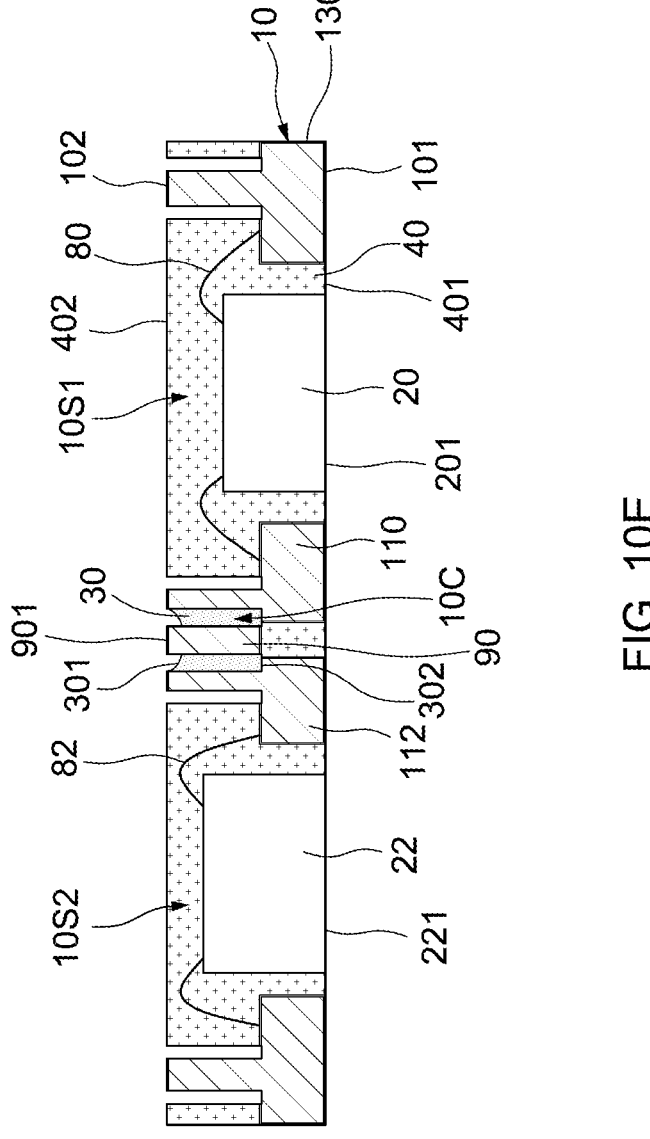

Referring to FIG. 10E, a blocking element 30 may be formed in the recess 10C. As such, the semiconductor device package 5C is formed.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of said numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and the like. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising:
a carrier having a first surface and a second surface opposite to the first surface;
a sensor device and a first device embedded in the carrier; and
a protective element encapsulating the carrier, the sensor device, and the first device, wherein the first surface of the carrier, a first surface of the sensor device, and a surface of the first device are exposed from a first surface of the protective element,
wherein the sensor device comprises a sensing portion and a protective portion adjacent to the sensing portion, and the protective portion of the sensor device has the first surface exposed from the first surface of the protective element and the first surface of the carrier,
wherein the first surface of the sensor device is configured to allow a light having a predetermined wavelength receivable by the sensing portion to pass through, wherein the protective element is configured to block the light to be received by the sensor device, and wherein the sensing portion comprises a sensing region disposed at a second surface of the sensor device opposite to the first surface.

2. The semiconductor device package as claimed in claim 1, wherein the carrier has a recess recessed from the first surface or the second surface of the carrier, and the semiconductor device package further comprises a light blocking element disposed in the recess.

3. The semiconductor device package as claimed in claim 2, wherein the light blocking element contacts the protective element.

4. The semiconductor device package as claimed in claim 2, wherein the light blocking element is configured to block the light from the first device.

5. The semiconductor device package as claimed in claim 2, wherein the light blocking element has a recessed surface.

6. The semiconductor device package as claimed in claim 2, wherein the carrier comprises a plurality of conductive portions, and the light blocking element contacts the plurality of conductive portions.

7. The semiconductor device package as claimed in claim 1, wherein the carrier is a leadframe comprising a first lead and a second lead separated from the first lead, and the first lead and the second lead are electrically connected to the sensor device and the first device, respectively.

8. The semiconductor device package as claimed in claim 1, wherein the sensing region is covered by the protective element.

9. The semiconductor device package as claimed in claim 1, wherein a sensing range of the sensing portion is defined by the first surface of the sensor device exposed from the protective element and the carrier.

10. The semiconductor device package as claimed in claim 1, wherein the carrier has a through hole, and the sensor device is disposed in the through hole.

11. The semiconductor device package as claimed in claim 10, further comprising a connection element disposed in the through hole and electrically connecting the second surface of the sensor device to a stepped portion of the carrier.

12. The semiconductor device package as claimed in claim 1, wherein the first surface of the carrier, the first surface of the protective portion, and the first surface of the protective element are substantially level.

13. The semiconductor device package as claimed in claim 12, wherein the protective element has a second surface opposite to the first surface of the protective element, and the second surface of the carrier is exposed from the second surface of the protective element to be electrically connected to a substrate.

14. The semiconductor device package as claimed in claim 1, wherein the carrier has a recess recessed from the first surface of the carrier and between the sensor device and the first device, and the semiconductor device package further comprises a reinforcing element filled in the recess and contacting the protective element.

15. The semiconductor device package as claimed in claim 14, further comprising a surface protection layer covering the first surface of the carrier and free from covering a lateral surface of the carrier, and the reinforcing element further contacts the lateral surface of the carrier and a portion of the surface protection layer.

16. The semiconductor device package as claimed in claim 15, wherein a lateral surface of the protective element substantially aligns with a lateral surface of the surface protection layer.

* * * * *